United States Patent
Ishizu et al.

(10) Patent No.: US 12,433,019 B2
(45) Date of Patent: Sep. 30, 2025

(54) SEMICONDUCTOR DEVICE

(71) Applicant: SEMICONDUCTOR ENERGY LABORATORY CO., LTD., Atsugi (JP)

(72) Inventors: Takahiko Ishizu, Kanagawa (JP); Takayuki Ikeda, Kanagawa (JP); Atsushi Miyaguchi, Kanagawa (JP); Shunpei Yamazaki, Tokyo (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 521 days.

(21) Appl. No.: 17/770,360

(22) PCT Filed: Oct. 20, 2020

(86) PCT No.: PCT/IB2020/059829
§ 371 (c)(1),
(2) Date: Apr. 20, 2022

(87) PCT Pub. No.: WO2021/084372
PCT Pub. Date: May 6, 2021

(65) Prior Publication Data
US 2022/0384433 A1 Dec. 1, 2022

(30) Foreign Application Priority Data
Nov. 1, 2019 (JP) .................. 2019-199663

(51) Int. Cl.
*H10D 84/85* (2025.01)
*H01L 21/02* (2006.01)
(Continued)

(52) U.S. Cl.
CPC ..... *H10D 84/856* (2025.01); *H01L 21/02565* (2013.01); *H10D 30/6734* (2025.01);
(Continued)

(58) Field of Classification Search
CPC .......... H01L 27/0922; H01L 21/02565; H01L 21/8258; H01L 29/66969; H01L 29/78648;
(Continued)

(56) References Cited

U.S. PATENT DOCUMENTS 8,674,437 B2  3/2014  Shima
9,366,303 B2  6/2016  Ishida
(Continued)

FOREIGN PATENT DOCUMENTS

CN  103208494 A  7/2013
CN  108140404 A  6/2018
(Continued)

OTHER PUBLICATIONS

International Search Report (Application No. PCT/IB2020/059829), dated Jan. 19, 2021.
(Continued)

*Primary Examiner* — Ratisha Mehta
*Assistant Examiner* — Sophia W Kao
(74) *Attorney, Agent, or Firm* — Fish & Richardson P.C.

(57) ABSTRACT

A semiconductor device having a novel structure is provided. The semiconductor device includes a p-channel transistor and an n-channel transistor provided over a silicon substrate. One of a source and a drain of the p-channel transistor is electrically connected to a first power supply line, one of a source and a drain of the n-channel transistor is electrically connected to a second power supply line, and the other of the source and the drain of the p-channel transistor is connected to the other of the source and the drain of the n-channel transistor. The p-channel transistor includes a first gate electrode and a first back gate electrode provided to face the first gate electrode with a first channel formation region therebetween. The first back gate electrode
(Continued)

is formed using a region where an impurity element imparting conductivity is selectively introduced to the silicon substrate. The n-channel transistor is provided above a layer including the p-channel transistor.

4 Claims, 20 Drawing Sheets

(51) Int. Cl.
*H10D 30/67* (2025.01)
*H10D 84/08* (2025.01)
*H10D 99/00* (2025.01)

(52) U.S. Cl.
CPC ......... *H10D 30/6755* (2025.01); *H10D 84/08* (2025.01); *H10D 99/00* (2025.01)

(58) Field of Classification Search
CPC ......... H01L 29/7869; H01L 21/823828; H01L 27/0688; H01L 27/1207; H01L 29/78696
See application file for complete search history.

(56) References Cited

U.S. PATENT DOCUMENTS

| | | | |
|---|---|---|---|
| 9,502,434 B2 | 11/2016 | Tanaka et al. | |
| 9,685,560 B2 | 6/2017 | Yamazaki et al. | |
| 9,711,549 B2 | 7/2017 | Yamazaki et al. | |
| 9,721,951 B2 | 8/2017 | Ikeda et al. | |
| 9,786,495 B2 | 10/2017 | Shimomura et al. | |
| 9,837,546 B2 | 12/2017 | Yamazaki et al. | |
| 9,947,800 B2 | 4/2018 | Yamazaki et al. | |
| 9,972,395 B2 | 5/2018 | Tran et al. | |
| 10,062,790 B2 | 8/2018 | Yamazaki et al. | |
| 10,096,715 B2 * | 10/2018 | Yamazaki | H10D 30/6704 |
| 10,115,830 B2 | 10/2018 | Yamazaki | |
| 10,121,705 B2 | 11/2018 | Shinohara et al. | |
| 10,297,327 B2 | 5/2019 | Tran et al. | |
| 10,522,691 B2 | 12/2019 | Yamazaki et al. | |
| 10,693,013 B2 | 6/2020 | Toriumi et al. | |
| 11,075,300 B2 | 7/2021 | Yamazaki et al. | |
| 11,217,703 B2 | 1/2022 | Toriumi et al. | |
| 11,538,940 B2 | 12/2022 | Yamazaki et al. | |
| 2012/0063208 A1 | 3/2012 | Koyama et al. | |
| 2013/0181288 A1 | 7/2013 | Shima | |
| 2014/0340118 A1* | 11/2014 | Ferrant | H10D 84/834 326/57 |
| 2015/0263175 A1* | 9/2015 | Koyama | G11C 16/3418 377/64 |
| 2015/0263707 A1* | 9/2015 | Kumar | H03K 3/3565 327/205 |
| 2016/0284862 A1 | 9/2016 | Yamazaki et al. | |
| 2016/0301404 A1* | 10/2016 | Agrawal | H10D 64/514 |
| 2017/0098474 A1 | 4/2017 | Tran et al. | |
| 2019/0067487 A1 | 2/2019 | Yamazaki | |
| 2022/0037532 A1 | 2/2022 | Toriumi et al. | |
| 2023/0093689 A1 | 3/2023 | Yamazaki et al. | |
| 2024/0113230 A1 | 4/2024 | Yamazaki et al. | |
| 2024/0322046 A1 | 9/2024 | Toriumi et al. | |

FOREIGN PATENT DOCUMENTS

| | | |
|---|---|---|
| EP | 3341937 A | 7/2018 |
| JP | 2012-129291 A | 7/2012 |
| JP | 2013-149677 A | 8/2013 |
| JP | 2014-003184 A | 1/2014 |
| JP | 2015-003555 A | 1/2015 |
| JP | 2015-103555 A | 6/2015 |
| JP | 2015-213164 A | 11/2015 |
| JP | 2016-034023 A | 3/2016 |
| JP | 2016-066788 A | 4/2016 |
| JP | 2016-174147 A | 9/2016 |
| JP | 2016-184731 A | 10/2016 |
| JP | 2016-189464 A | 11/2016 |
| JP | 2016-201541 A | 12/2016 |
| JP | 2018-531477 | 10/2018 |
| KR | 2018-0061333 A | 6/2018 |
| TW | 201729203 | 8/2017 |
| TW | 201818413 | 5/2018 |
| WO | WO-2015/159179 | 10/2015 |
| WO | WO-2016/166628 | 10/2016 |
| WO | WO-2017/062144 | 4/2017 |

OTHER PUBLICATIONS

Written Opinion (Application No. PCT/IB2020/059829), dated Jan. 19, 2021.
Ishizu.T et al., "Embedded Oxide Semiconductor Memories: A Key Enabler for Low-Power ULSI", ECS Transactions, May 21, 2017, vol. 79, No. 1, pp. 149-156, The Electrochemical Society.
Yamazaki.S et al., "Properties of crystalline In—Ga—Zn-oxide semiconductor and its transistor characteristics", Jpn. J. Appl. Phys. (Japanese Journal of Applied Physics), Mar. 31, 2014, vol. 53, No. 4S, pp. 04ED18-1-04ED18-10.
Kato.K et al., "Evaluation of Off-State Current Characteristics of Transistor Using Oxide Semiconductor Material, Indium-Gallium-Zinc Oxide", Jpn. J. Appl. Phys. (Japanese Journal of Applied Physics), 2012, vol. 51, pp. 021201-1-021201-7.
Amano.S et al., "Low Power LC Display Using In—Ga—Zn-Oxide TFTs Based on Variable Frame Frequency", SID Digest '10 : SID International Symposium Digest of Technical Papers, May 23, 2010, vol. 41, No. 1, pp. 626-629.

* cited by examiner

SEMICONDUCTOR DEVICE

CROSS REFERENCE TO RELATED APPLICATIONS

This application is a U.S. National Phase Application under 35 U.S.C. § 371 of International Application PCT/IB2020/059829, filed on Oct. 20, 2020, which is incorporated by reference and claims the benefit of a foreign priority application filed in Japan on Nov. 1, 2019, as Application No. 2019-199663.

TECHNICAL FIELD

In this specification, a semiconductor device and the like are described.

Note that one embodiment of the present invention is not limited to the above technical field. Examples of the technical field of one embodiment of the present invention disclosed in this specification and the like include a semiconductor device, an imaging device, a display device, a light-emitting device, a power storage device, a memory device, a display system, an electronic device, a lighting device, an input device, an input/output device, a driving method thereof, and a manufacturing method thereof.

BACKGROUND ART

As a semiconductor that can be used in a transistor, a metal oxide has been attracting attention. An In—Ga—Zn oxide called "IGZO" and the like is a typical multi-component metal oxide. From the researches on IGZO, a CAAC (c-axis aligned crystalline) structure and an nc (nanocrystalline) structure, which are neither single crystal nor amorphous, have been found (e.g., Non-Patent Document 1).

It has been reported that a transistor including a metal oxide semiconductor in a channel formation region (hereinafter, sometimes referred to as an "oxide semiconductor transistor" or an "OS transistor") has an extremely low off-state current (e.g., Non-Patent Documents 1 and 2). A variety of semiconductor devices using OS transistors have been manufactured (e.g., Non-Patent Documents 3 and 4).

The manufacturing process of an OS transistor can be incorporated in a CMOS process with a transistor containing silicon in a channel formation region (a Si transistor), and an OS transistor can be stacked over a Si transistor. For example, Patent Document 1 discloses a structure in which a plurality of memory cell array layers including OS transistors are stacked over a substrate provided with a Si transistor.

In a logic circuit formed by a CMOS process, variation in characteristics such as threshold voltage of a p-channel transistor and an n-channel transistor is preferably small for achieving low-voltage driving. Patent Document 2 discloses a structure called a transistor in which a well region under a buried insulating layer directly under a thin silicon film is used as a back gate in a fully-depleted silicon on insulator (FD-SOI). In this transistor, few impurity elements that impart conductivity are added to a channel formation region; thus, variation in characteristics such as threshold voltage and current can be reduced, resulting in advantages such as excellent short-channel characteristics.

REFERENCES

Patent Documents

[Patent Document 1] United States Patent Application Publication No. 2012/0063208

[Patent Document 2] Japanese Published Patent Application No. 2015-103555

Non-Patent Documents

[Non-Patent Document 1] S. Yamazaki et al., "Properties of crystalline In—Ga—Zn-oxide semiconductor and its transistor characteristics", Jpn. J. Appl. Phys., vol. 53, 04ED18 (2014).

[Non-Patent Document 2] K. Kato et al., "Evaluation of Off-State Current Characteristics of Transistor Using Oxide Semiconductor Material, Indium-Gallium-Zinc Oxide", Jpn. J. Appl. Phys., vol. 51, 021201 (2012).

[Non-Patent Document 3] S. Amano et al., "Low Power LC Display Using In—Ga—Zn-Oxide TFTs Based on Variable Frame Frequency", SID Symp. Dig. Papers, vol. 41, pp. 626-629 (2010).

[Non-Patent Document 4] T. Ishizu et al., "Embedded Oxide Semiconductor Memories: A Key Enabler for Low-Power ULSI", ECS Tran., vol. 79, pp. 149-156 (2017).

SUMMARY OF THE INVENTION

Problems to be Solved by the Invention

In the case where a complementary logic circuit is formed using transistors provided over an FD-SOI substrate, a structure in which back gates for controlling threshold voltage are provided is effective in achieving low-voltage driving. However, this structure increases the number of electrodes or the like for controlling the potentials of the back gates; thus, the circuit area increases. In addition, a manufacturing process is complicated because of the need for separately forming a p-channel transistor and an n-channel transistor.

Current (on-state current), which flows when a transistor is turned on, of a Si transistor is much higher than on-state current of an OS transistor. Thus, in the case where a logic circuit such as an inverter circuit is designed such that an OS transistor is formed over a Si transistor, the size of the OS transistor is necessarily larger than the size of the Si transistor, leading to unbalanced transistor sizes.

In addition, the Si transistor and the OS transistor have different electrical characteristics with respect to temperature. For example, the on-state current of the Si transistor decreases at high temperatures and increases at low temperatures, whereas the on-state current of the OS transistor increases at high temperatures and decreases at low temperatures. Hence, in the case where a logic circuit is designed such that the OS transistor is formed over the Si transistor, stable operation with respect to a temperature change is difficult to achieve.

An object of one embodiment of the present invention is to provide a small semiconductor device suitable for a circuit area reduction. Another object of one embodiment of the present invention is to provide a semiconductor device excellent in operating stably with respect to a temperature change. Another object of one embodiment of the present invention is to provide a semiconductor device excellent in reducing power consumption. Another object is to provide a semiconductor device with a novel structure.

One embodiment of the present invention does not necessarily achieve all the above objects and only needs to achieve at least one of the objects. The description of the above objects does not preclude the existence of other objects. Objects other than these objects will be apparent from the description of the specification, the claims, the drawings, and the like, and objects other than these objects can be derived from the description of the specification, the claims, the drawings, and the like.

Means for Solving the Problems

One embodiment of the present invention is a semiconductor device including a p-channel transistor and an n-channel transistor provided over a silicon substrate, in which one of a source and a drain of the p-channel transistor is electrically connected to a first power supply line, one of a source and a drain of the n-channel transistor is electrically connected to a second power supply line, the other of the source and the drain of the p-channel transistor is connected to the other of the source and the drain of the n-channel transistor, the p-channel transistor includes a first gate electrode and a first back gate electrode provided to face the first gate electrode with a first channel formation region therebetween, the first back gate electrode is formed using a region where an impurity element imparting conductivity is selectively introduced to the silicon substrate, and the n-channel transistor is provided above a layer including the p-channel transistor.

In the semiconductor device of one embodiment of the present invention, it is preferable that the n-channel transistor include a second channel formation region, and the second channel formation region include a metal oxide.

In the semiconductor device of one embodiment of the present invention, the metal oxide preferably contains In, Ga, and Zn.

In the semiconductor device of one embodiment of the present invention, it is preferable that the n-channel transistor include a second back gate electrode, and a potential supplied to the first back gate electrode be lower than a potential supplied to the second back gate electrode.

One embodiment of the present invention is a semiconductor device including a p-channel transistor and an n-channel transistor provided over a silicon substrate, in which one of a source and a drain of the p-channel transistor is electrically connected to a first power supply line, one of a source and a drain of the n-channel transistor is electrically connected to a second power supply line, the other of the source and the drain of the p-channel transistor is connected to the other of the source and the drain of the n-channel transistor, the p-channel transistor includes a first gate electrode and a first back gate electrode provided to face the first gate electrode with a first channel formation region therebetween, the first back gate electrode is formed using a region where an impurity element imparting conductivity is selectively introduced to the silicon substrate, the n-channel transistor includes a second gate electrode and a second back gate electrode provided to face the second gate electrode with a second channel formation region therebetween, and the re-channel transistor is provided above a layer including the p-channel transistor.

In the semiconductor device of one embodiment of the present invention, the second channel formation region preferably includes a metal oxide.

In the semiconductor device of one embodiment of the present invention, the metal oxide preferably contains In, Ga, and Zn.

In the semiconductor device of one embodiment of the present invention, a potential supplied to the first back gate electrode is preferably lower than a potential supplied to the second back gate electrode.

Note that other embodiments of the present invention will be shown in the description of the following embodiments and the drawings.

Effect of the Invention

One embodiment of the present invention can provide a small semiconductor device suitable for a circuit area reduction. Another embodiment of the present invention can provide a semiconductor device excellent in operating stably with respect to a temperature change. Another embodiment of the present invention can provide a semiconductor device excellent in reducing power consumption. Alternatively, a semiconductor device with a novel structure can be provided.

The description of a plurality of effects does not preclude the existence of other effects. One embodiment of the present invention does not necessarily achieve all the effects described as examples. In one embodiment of the present invention, other objects, effects, and novel features will be apparent from the description of the specification and the drawings.

MODE FOR CARRYING OUT THE INVENTION

Figure 1A:
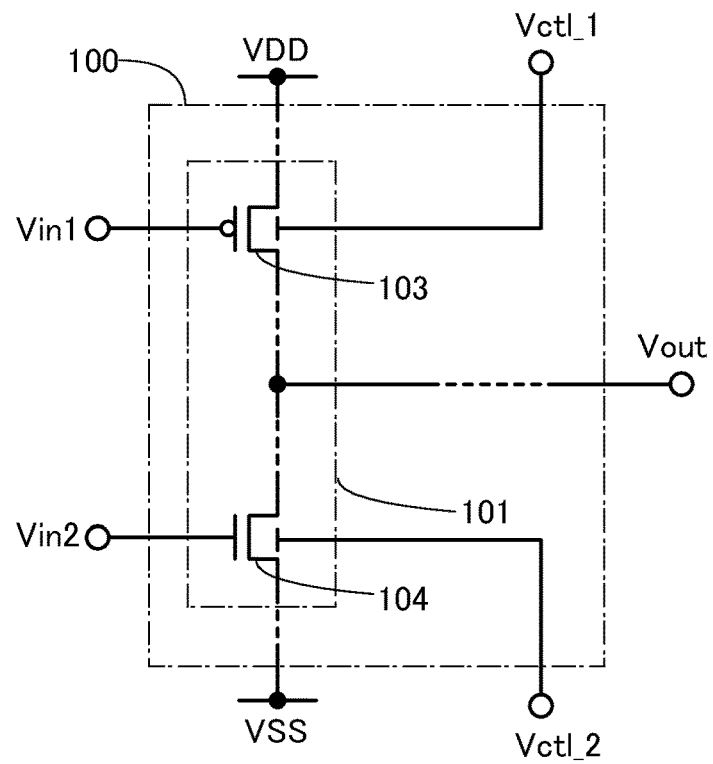
FIG. 1A and FIG. 1B are diagrams each illustrating a structure example of a semiconductor device.

Embodiments of the present invention will be described below. Note that one embodiment of the present invention is not limited to the following description, and it will be readily appreciated by those skilled in the art that modes and details of the present invention can be modified in various ways without departing from the spirit and scope of the present invention. One embodiment of the present invention therefore should not be construed as being limited to the following description of the embodiments.

Note that ordinal numbers such as "first", "second", and "third" in this specification and the like are used in order to avoid confusion among components. Thus, the terms do not limit the number of components. In addition, the terms do not limit the order of components. Furthermore, in this specification and the like, for example, a "first" component in one embodiment can be referred to as a "second" component in other embodiments or claims. Furthermore, in this specification and the like, for example, a "first" component in one embodiment can be omitted in other embodiments or claims.

The same components, components having similar functions, components made of the same material, components formed at the same time, and the like in the drawings are denoted by the same reference numerals, and repetitive description thereof is skipped in some cases.

In this specification, a power supply potential VDD may be abbreviated to a potential VDD, VDD, or the like, for example. The same applies to other components (e.g., a signal, a voltage, a circuit, an element, an electrode, a wiring, and the like).

Moreover, when a plurality of components are denoted by the same reference numerals, and, in particular, need to be distinguished from each other, an identification sign such as "_1", "_2", "[n]", or "[m,n]" is sometimes added to the reference numerals. For example, the second wiring GL is referred to as a wiring GL[2].

Embodiment 1

A structure and the like of a semiconductor device of one embodiment of the present invention will be described.

Note that in this specification and the like, a semiconductor device generally means a device that can function by utilizing semiconductor characteristics. A semiconductor element such as a transistor, a semiconductor circuit, a logic circuit, an arithmetic device, and a memory device are each one embodiment of a semiconductor device. It can be sometimes said that a display device (a liquid crystal display device, a light-emitting display device, or the like), a projection device, a lighting device, an electro-optical device, a power storage device, a memory device, a semiconductor circuit, an imaging device, an electronic device, and the like include a semiconductor device.

FIG. 1A is a diagram illustrating a semiconductor device 100 of one embodiment of the present invention.

The semiconductor device 100 illustrated in FIG. 1A includes a logic portion 101 that performs logic operation. The logic portion 101 includes at least a p-channel transistor 103 and an n-channel transistor 104. In the logic portion 101, logic operation to be performed is uniquely determined in accordance with the numbers of p-channel transistors 103 and n-channel transistors 104 and the connection structure thereof. One output value can be obtained from a plurality of input values by the logic operation performed in the logic portion 101.

Note that the input value means a logic value represented by a potential Vin of an input signal input to the semiconductor device 100. The output value means a logic value represented by a potential Vout of an output signal output from the semiconductor device 100.

The p-channel transistor 103 and the n-channel transistor 104 are connected in series between a power supply line to which a high-level potential VDD is supplied and a power supply line to which a low-level potential VSS is supplied. A state in which transistors are connected in series means, for example, a state in which only one of a source and a drain of a transistor is connected to only one of a source and a drain of another transistor.

In FIG. 1A, one of a source and a drain of the p-channel transistor 103 is connected to the power supply line to which the potential VDD is supplied. One of a source and a drain of the n-channel transistor 104 is connected to the power supply line to which the potential VSS is supplied. The other of the source and the drain of the p-channel transistor 103 is connected to the other of the source and the drain of the n-channel transistor 104. A potential of a node where the other of the source and the drain of the p-channel transistor 103 is connected to the other of the source and the drain of the n-channel transistor 104 is output as a potential Vout of an output signal.

In one embodiment of the present invention, the transistors included in the logic portion 101 are each provided with a back gate electrode for controlling threshold voltage, in addition to a gate electrode.

The p-channel transistor 103 includes the gate electrode and the back gate electrode. The n-channel transistor 104 includes the gate electrode and the back gate electrode. The threshold voltage of each transistor is controlled in response to the level of the potential of the back gate electrode, specifically, a potential difference between the source and the back gate electrode.

A semiconductor layer included in the p-channel transistor 103 is silicon. That is, the p-channel transistor 103 is a Si transistor. The p-channel transistor 103 is a transistor formed using an insulating layer formed with an oxide buried into a silicon substrate (also referred to as a BOX (Burried oxide) layer) and an SOI (Silicon On Insulator) substrate including a thin film of single crystal silicon over the insulating layer. Note that in this specification, an example is described in which the SOI substrate is formed by a SIMOX (Separated by Implanted Oxygen) method, and the SOI substrate formed by a Smart Cut method can be used.

A region (a well region) to which an impurity element imparting conductivity is added can be provided to overlap with the silicon substrate in a region where the p-channel transistor 103 is provided. The well region can serve as a back gate electrode by independently changing the potential of the well region. Accordingly, the threshold voltage of the Si transistor can be controlled. In particular, when a positive potential is applied to the well region, the threshold voltage of the Si transistor can be further increased, and the off-state current can be reduced. Therefore, a positive potential is applied to the well region, so that drain current when a potential applied to a gate electrode of the Si transistor is 0 V can be reduced. Furthermore, addition of the impurity element to the channel formation region for the purpose of controlling the threshold voltage is not necessary, variation in threshold voltage can be reduced, and the power supply voltage can be lowered.

A semiconductor layer included in the n-channel transistor 104 is an oxide semiconductor (metal oxide). That is, the n-channel transistor 104 is an OS transistor.

A metal oxide has a band gap of 2.5 eV or wider; thus, an OS transistor has an extremely low off-state current. For example, the off-state current per micrometer in channel width at a source-drain voltage of 3.5 V and room temperature (25° C.) can be lower than $1\times10^{-20}$ A, lower than $1\times10^{-22}$ A, or lower than $1\times10^{-24}$ A. That is, the on/off ratio of drain current can be greater than or equal to 20 digits and less than or equal to 150 digits.

A highly integrated semiconductor device generates heat due to circuit drive in some cases. This heat makes the temperature of a transistor rise to change the characteristics of the transistor, and the field-effect mobility thereof might change or the operation frequency thereof might decrease, for example. Since an OS transistor has a higher heat resistance than a Si transistor, the field-effect mobility is less likely to change and the operation frequency is less likely to decrease due to a temperature change. Even when the temperature becomes high, an OS transistor is likely to keep a property of the drain current increasing exponentially with respect to a gate-source voltage. Thus, the use of an OS transistor enables stable operation in a high-temperature environment.

In the semiconductor device 100, the n-channel transistor 104, which is the OS transistor, can be provided to be stacked over the p-channel transistor 103, which is the Si transistor; thus, the n-channel transistor and the p-channel transistor can be provided without an increase in the circuit area. In one embodiment of the present invention, the p-channel transistor, which is the Si transistor, is provided over the well region serving as the back gate; hence, the on-state current can be reduced by control of the threshold voltage. This eliminates the need for designing the OS transistor such that its channel length (L) or channel width (W) is larger than that of the Si transistor in order that the on-state current of the OS transistor is in balance with that of the Si transistor. As a result, a transistor size reduction in the semiconductor device is possible.

A potential Vin1 of an input signal is supplied to the gate electrode of the p-channel transistor 103. A potential Vin2 of an input signal is supplied to the gate electrode of the re-channel transistor 104. The potential Vin1 and the potential Vin2 of the two input signals may have the same level or a predetermined potential difference. Note that the logic value of the potential Vin1 accords with the logic value of the potential Vin2.

The operation of the semiconductor device 100 is described below by giving the case where the potential Vin1 and the potential Vin2 have the same level as an example.

In FIG. 1A, the switching of the p-channel transistor 103 is performed in accordance with gate voltage Vgs corresponding to a difference between the potential of the gate electrode and the potential of the source electrode. Note that the gate voltage Vgs of the p-channel transistor 103 is a potential difference between the potential Vin1 of the input signal supplied to the gate electrode and the potential VDD. Thus, when the threshold voltage of the p-channel transistor 103 is Vthp and the relation of Vthp<0 is satisfied, the p-channel transistor 103 is turned on when the relation of Vin1−VDD≤−|Vthp| is satisfied and is turned off when the relation of Vin1−VDD>−|Vthp| is satisfied.

The switching of the n-channel transistor 104 is also performed in accordance with gate voltage Vgs corresponding to a difference between the potential of the gate electrode and the potential of the source electrode. The gate voltage Vgs of the n-channel transistor 104 is a potential difference between the potential Vin2 of the input signal supplied to the gate electrode and the potential VSS. Thus, when the threshold voltage of the n-channel transistor 104 is Vthn and the relation of Vthn>0 is satisfied, the n-channel transistor 104 is turned on when the relation of Vin2−VSS≥|Vthn| is satisfied and is turned off when the relation of Vin2−VSS<|Vthn| is satisfied.

In order to suppress through current between the power supply lines, it is preferable to operate the p-channel transistor 103 and the n-channel transistor 104 such that, when one of the transistors is on, the other is off. That is, the values of the threshold voltage Vthp and the threshold voltage Vthn are controlled such that the p-channel transistor 103 and the n-channel transistor 104 are prevented from being on concurrently.

When the relation of Vin1=Vin2=Vin is satisfied, the potential Vin at which both the p-channel transistor 103 and the n-channel transistor 104 are on is in the range of VSS+|Vthn|≤Vin≤VDD−|Vthp|. Thus, in order to suppress through current, it is preferable to increase the absolute value of the threshold voltage Vthp and the absolute value of the threshold voltage Vthn to narrow the range of the potential Vin.

The absolute value of the threshold voltage Vthp tends to be larger as a potential Vctl_1 supplied to the back gate electrode is higher. On the other hand, the absolute value of the threshold voltage Vthp tends to be smaller as the potential Vctl_1 supplied to the back gate electrode is lower. Thus, in one embodiment of the present invention, through current is suppressed by making the potential Vctl_1 higher than the potential VSS and increasing the absolute value of the threshold voltage Vthp.

The absolute value of the threshold voltage Vthn tends to be larger as a potential Vctl_2 supplied to the back gate electrode is lower. On the other hand, the absolute value of the threshold voltage Vthn tends to be smaller as the potential Vctl_2 supplied to the back gate electrode is higher. Thus, in one embodiment of the present invention, through current is suppressed by making the potential Vctl_2 lower than the potential VSS and increasing the absolute value of the threshold voltage Vthn.

Note that when the absolute value of the threshold voltage Vthp is further increased, the p-channel transistor 103 and the n-channel transistor 104 can be prevented from being turned on at the same time regardless of the value of the potential Vin; thus, through current can be further suppressed. However, when the absolute value of the threshold voltage Vthp is too large, a period during which both the p-channel transistor 103 and the n-channel transistor 104 are off appears depending on the value of the potential Vin. In the period during which both the p-channel transistor 103 and the n-channel transistor 104 are off, the potential Vout of the output signal becomes unstable. In order to prevent this unstable state, it is preferable to control the value of the threshold voltage Vthp such that the value of VDD−|Vthp| is not smaller than the value of VSS+|Vthn|.

In the case of the n-channel transistor 104, the absolute value of the threshold voltage Vthn tends to be smaller as the potential supplied to the back gate electrode is higher. On the other hand, the absolute value of the threshold voltage Vthn tends to be larger as the potential supplied to the back gate electrode is lower. Thus, in the case of the n-channel transistor 104, through current is suppressed by making the potential of the back gate electrode lower than the potential VSS and increasing the absolute value of the threshold voltage Vthn.

Similar to the case of the threshold voltage Vthp, when the absolute value of the threshold voltage Vthn is too large, a period during which both the p-channel transistor 103 and the n-channel transistor 104 are off appears depending on the value of the potential Vin. Thus, in order to prevent the potential Vout of the output signal from being unstable, it is preferable to control the value of the threshold voltage Vthn such that the value of VSS+|Vthn| is not larger than the value of VDD−|Vthp|.

Figure 1B:
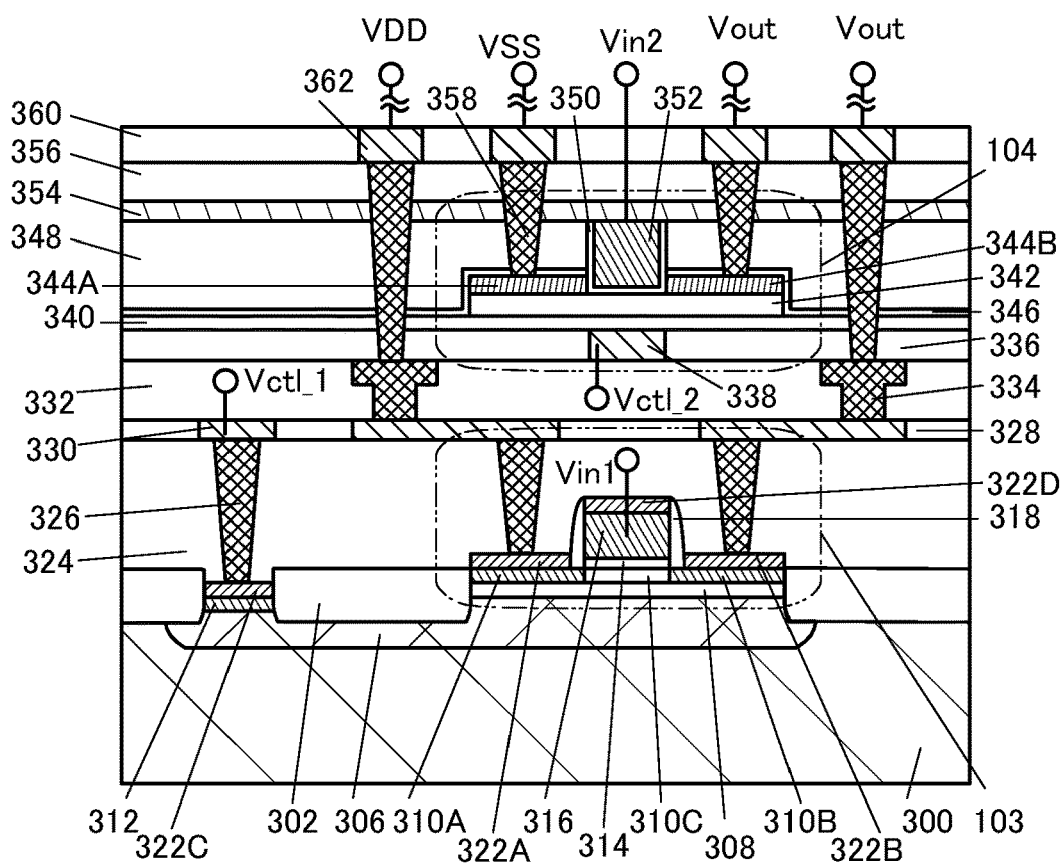

Next, the structures of the p-channel transistor 103 and the n-channel transistor 104 used in the semiconductor device 100 will be described. FIG. 1B illustrates an example of a cross-sectional structure of the p-channel transistor 103 and the n-channel transistor 104.

In FIG. 1B, the p-channel transistor 103 and the n-channel transistor 104 included in the logic portion 101 are formed over a silicon substrate 300. Note that the description in Embodiment 2 below can be referred to for the details of the components.

An insulating layer 302 and a well region 306 are formed over the silicon substrate 300. The insulating layer 302 functions as an element isolation layer. The well region 306 functions as a back gate electrode. Impurity regions 310A and 310B and a channel formation region 310C, which function as a semiconductor layer, are provided over the well region 306 with an insulating layer 308, which is a BOX layer, therebetween. In addition, over the well region 306, an impurity region 312 and a conductive layer 322C for supplying the potential Vctl_1 to the well region 306 are formed. An insulating layer 314, a conductive layer 316, and a conductive layer 322D are formed over the channel formation region 310C. The conductive layer 316 and the conductive layer 322D function as a gate electrode to which the potential Vin1 is supplied. The insulating layer 314 functions as a gate insulating film. An insulating layer 318, a conductive layer 322A, and a conductive layer 322B are formed over the impurity regions 310A and 310B. The insulating layer 318 functions as a sidewall insulating layer (a sidewall). Over the p-channel transistor 103, an insulating layer 324 functioning as an interlayer insulating film and a conductive layer 326 functioning as an electrode for supplying the potential Vctl_1 to the p-channel transistor 103 and the well region are formed. An insulating layer 328, a conductive layer 330, an insulating layer 332, and a conductive layer 334 are formed over the insulating layer 324 and the conductive layer 326.

An insulating layer 336 and a conductive layer 338 are formed over the insulating layer 332 and the conductive layer 334. The conductive layer 338 functions as a back gate electrode of the n-channel transistor to which the potential Vctl_2 is supplied. An insulating layer 340 is formed over the insulating layer 336 and the conductive layer 338. A semiconductor layer 342 of an oxide semiconductor is formed over the insulating layer 340. Conductive layers 344A and 344B, an insulating layer 350, and a conductive layer 352 are formed over the semiconductor layer 342. The conductive layer 344A and the conductive layer 344B function as a source electrode and a drain electrode of the n-channel transistor 104. The insulating layer 350 functions as a gate insulating film of the n-channel transistor 104. The conductive layer 352 functions as a gate electrode of the n-channel transistor 104. An insulating layer 346, an insulating layer 348, an insulating layer 354, and an insulating layer 356 are formed over the n-channel transistor 104. A conductive layer 358 is formed in the insulating layer 336, the insulating layer 340, the insulating layer 346, the insulating layer 348, the insulating layer 354, and the insulating layer 356. The conductive layer 358 functions as an electrode for supplying the potential VDD or the potential VSS or an electrode for extracting the potential Vout. An insulating layer 360 and a conductive layer 362 are formed over the insulating layer 356 and the conductive layer 358.

In the semiconductor device of one embodiment of the present invention, the threshold voltages of the p-channel transistor 103 and the n-channel transistor 104 included in the complementary logic circuit can be individually controlled by the potentials supplied to the back gate electrodes; thus, when the potentials of the gate electrodes of the p-channel transistor 103 and the n-channel transistor 104 are switched between a high level and a low level, one of the transistors can be made to turn off or a period during which both of the transistors are on can be shortened. Thus, the through current that flows through channel formation regions of the p-channel transistor 103 and the n-channel transistor 104 can be reduced. Furthermore, in the semiconductor device of one embodiment of the present invention, the use of an OS transistor as the n-channel transistor 104 can significantly reduce the off-state current that flows when both the p-channel transistor 103 and the n-channel transistor 104 are off.

Therefore, in the semiconductor device of one embodiment of the present invention, through current can be reduced; thus, power consumption can be suppressed. Alternatively, in the semiconductor device of one embodiment of the present invention, through current can be reduced; thus, heat generation can be suppressed and the reliability of the semiconductor device can be improved.

Figure 2A:
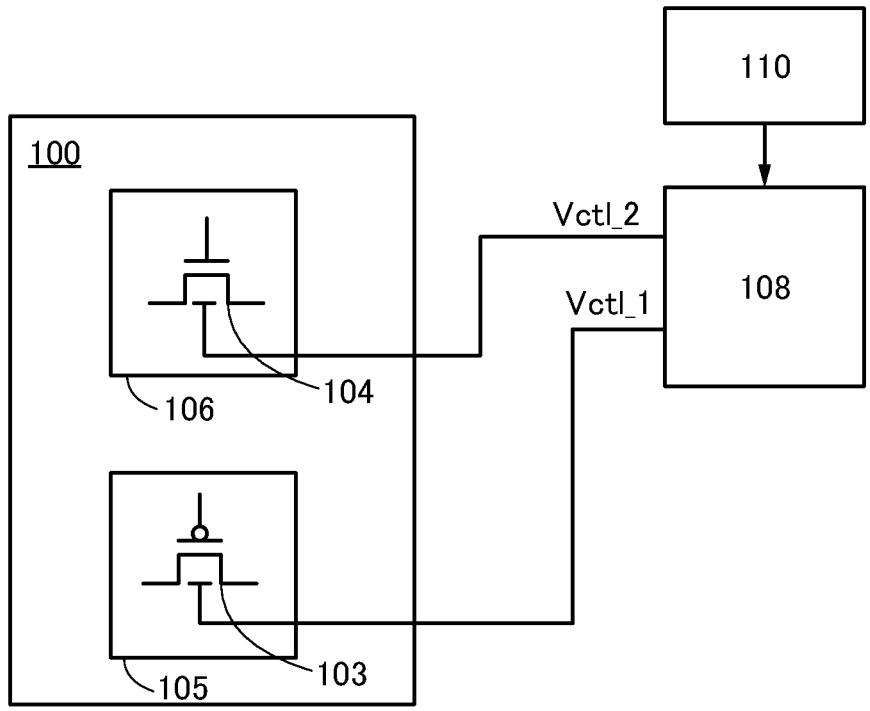
FIG. 2A and FIG. 2B are diagrams each illustrating a structure example of a semiconductor device.

FIG. 2A is a block diagram for describing the potentials Vctl_1 and Vctl_2 supplied to the semiconductor device 100.

In FIG. 2A, a transistor region 105 represents a region including the p-channel transistor 103. In FIG. 2A, a transistor region 106 represents a region including the n-channel transistor 104. The semiconductor device 100 may include a plurality of transistor regions 105 and a plurality of transistor regions 106.

In FIG. 2A, a control portion 108 outputs the potentials Vctl_1 and Vctl_2 that are respectively supplied to the p-channel transistor 103 and the n-channel transistor 104. The control portion 108 can individually control the potentials Vctl_1 and Vctl_2 in accordance with control by an arithmetic portion 110, thereby controlling the threshold voltages of the p-channel transistor 103 and the n-channel transistor 104. In the case where more than one transistor region 105 and more than one transistor region 106 are provided, a plurality of potentials corresponding to each of the potentials Vctl_1 and Vctl_2 are output.

In FIG. 2A, the arithmetic portion 110 outputs a signal for controlling the control portion 108 in response to data or the like of an external sensor such as a temperature sensor. Then, the control portion 108 outputs the potential Vctl_1 and Vctl_2 on the basis of the temperature. The temperature sensor can acquire data by monitoring the temperature of the surface of the semiconductor device 100, for example.

A structure in which the potentials Vctl_1 and Vctl_2 controlling the threshold voltages of the p-channel transistor 103 and the n-channel transistor 104 are individually generated and output as illustrated in FIG. 2A enables control based on a difference in electrical characteristics due to temperature between the p-channel transistor 103 and the n-channel transistor 104, i.e., a Si transistor and an OS transistor. Therefore, the semiconductor device 100 can be controlled to perform highly reliable operation.

Figure 2B:
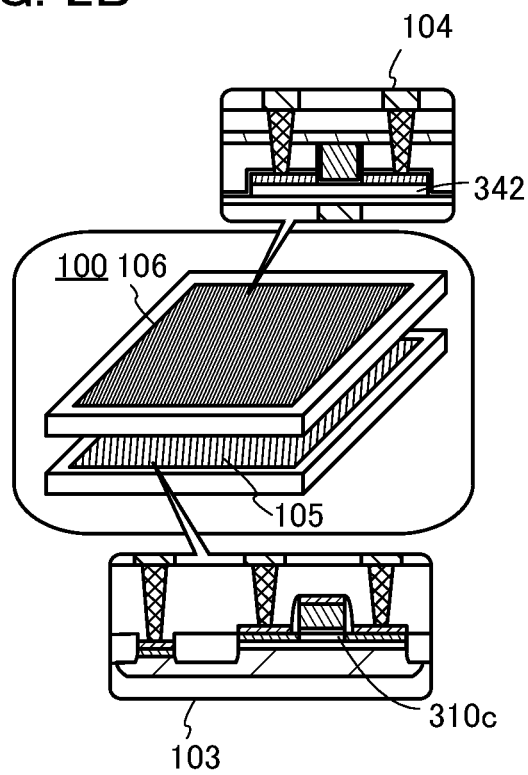

FIG. 2B is a diagram schematically illustrating a state in which the transistor region 105 and the transistor region 106 in the semiconductor device 100 described with reference to FIG. 2A are provided in different layers as illustrated in FIG. 1B. As illustrated in FIG. 2B, the transistor region 105 includes the p-channel transistor 103 including the channel formation region 310C formed of single crystal silicon. The transistor region 106 includes the n-channel transistor 104 including the semiconductor layer 342 formed of an oxide semiconductor.

When the n-channel transistor and the p-channel transistor are separately formed in different layers as illustrated in FIG. 2B, the potentials of the back gate electrodes can be easily controlled as compared to the case where the complementary logic circuit is formed using only Si transistors. Since the transistor region 105 includes the p-channel transistor in one embodiment of the present invention, the manufacturing process can be simplified as compared to the case where an n-channel transistor and a p-channel transistor are formed as Si transistors and a well region functioning as a back gate electrode is further provided.

Figure 3A:
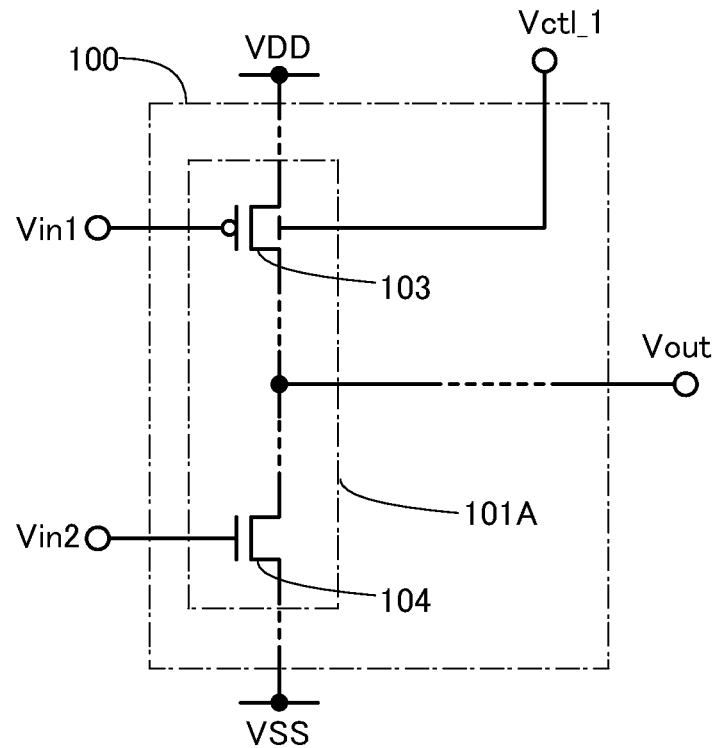
FIG. 3A and FIG. 3B are diagrams each illustrating a structure example of a semiconductor device.

FIG. 3A is a diagram for describing a modification example of the logic portion 101 in FIG. 1A. A logic portion 101A illustrated in FIG. 3A includes the n-channel transistor 104 without a back gate electrode.

Figure 3B:
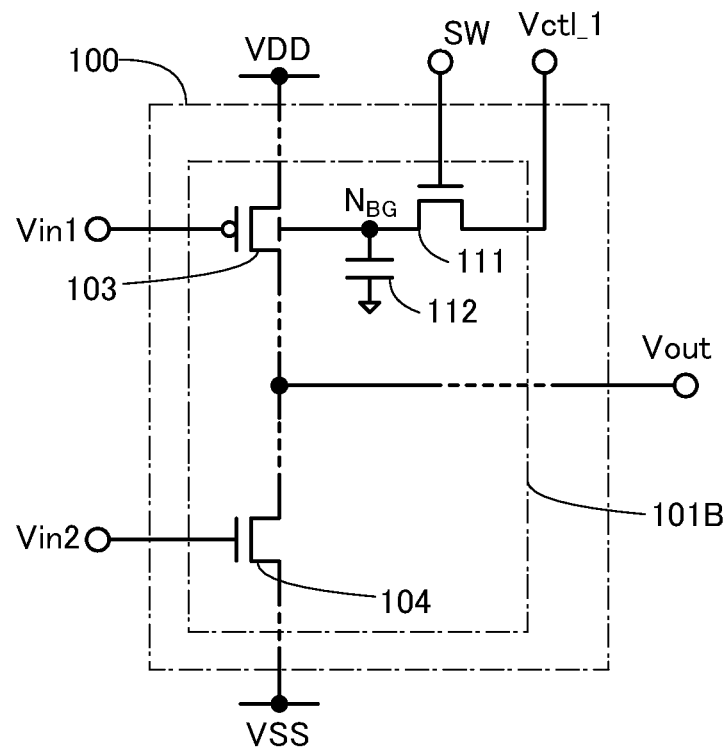

FIG. 3B is a diagram for describing a modification example of the logic portion 101 in FIG. 1A. A logic portion 101B illustrated in FIG. 3B includes a transistor 111 and a capacitor 112 that are connected to the back gate electrode of the p-channel transistor 103. An OS transistor is used as the transistor 111 and the transistor 111 is turned off by a control signal SW, whereby a potential of a node $N_{BG}$ of the back gate electrode of the p-channel transistor 103 can be retained with the transistor 111 with an extremely low off-state current. With the above structure, the potential of the back gate electrode can be retained and the threshold voltage of the p-channel transistor 103 can be set to a predetermined value even when a potential is not always supplied to the back gate electrode.

Figure 4A:
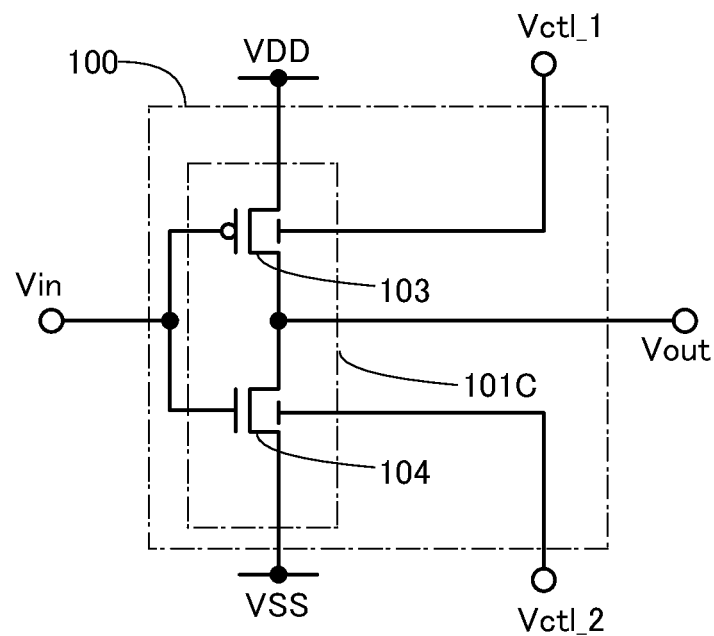
FIG. 4A and FIG. 4B are diagrams illustrating a structure example of a semiconductor device.

FIG. 4A is a diagram illustrating the semiconductor device 100 including a logic portion 101C functioning as an inverter circuit as a structure example of a logic circuit applicable to FIG. 1A.

In FIG. 4A, the gate electrode of the p-channel transistor 103 is connected to a wiring for supplying the potential Vin. The gate electrode of the n-channel transistor 104 is connected to the wiring for supplying the potential Vin. The back gate electrode of the p-channel transistor 103 is connected to a wiring for supplying the potential Vctl_1. The back gate electrode of the n-channel transistor 104 is connected to a wiring for supplying the potential Vctl_2.

In FIG. 4A, one of the source and the drain of the p-channel transistor 103 is connected to the power supply line to which the potential VDD is supplied. One of the source and the drain of the n-channel transistor 104 is connected to the power supply line to which the potential VSS is supplied. The other of the source and the drain of the p-channel transistor 103 is connected to the other of the source and the drain of the n-channel transistor 104. The potential of the node where the other of the source and the drain of the p-channel transistor 103 is connected to the other of the source and the drain of the n-channel transistor 104 is output as the potential Vout of an output signal.

Figure 4B:
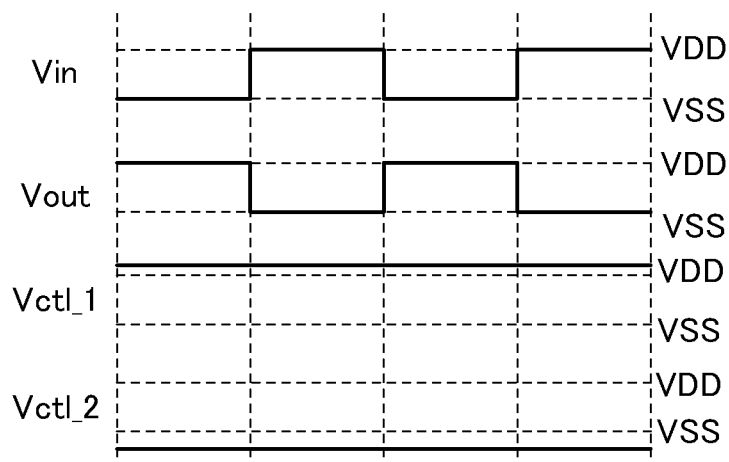

FIG. 4B shows an ideal timing chart for the inverter circuit illustrated in FIG. 4A. FIG. 4B shows the magnitude relationship between the potentials Vctl_1 and Vctl_2 and the potentials VDD and VSS. A potential whose logic is inverted from that of the potential Vin is obtained as the potential out. In order to suppress through current between the power supply lines, the values of the threshold voltage Vthp and the threshold voltage Vthn are controlled such that the p-channel transistor 103 and the n-channel transistor 104 are prevented from being turned on at the same time. Specifically, the potential Vctl_1 is set higher than the potential VDD and the potential Vctl_2 is set lower than the potential VSS to reduce the absolute value of the threshold voltage Vthn, so that through current can be suppressed.

Figure 5:
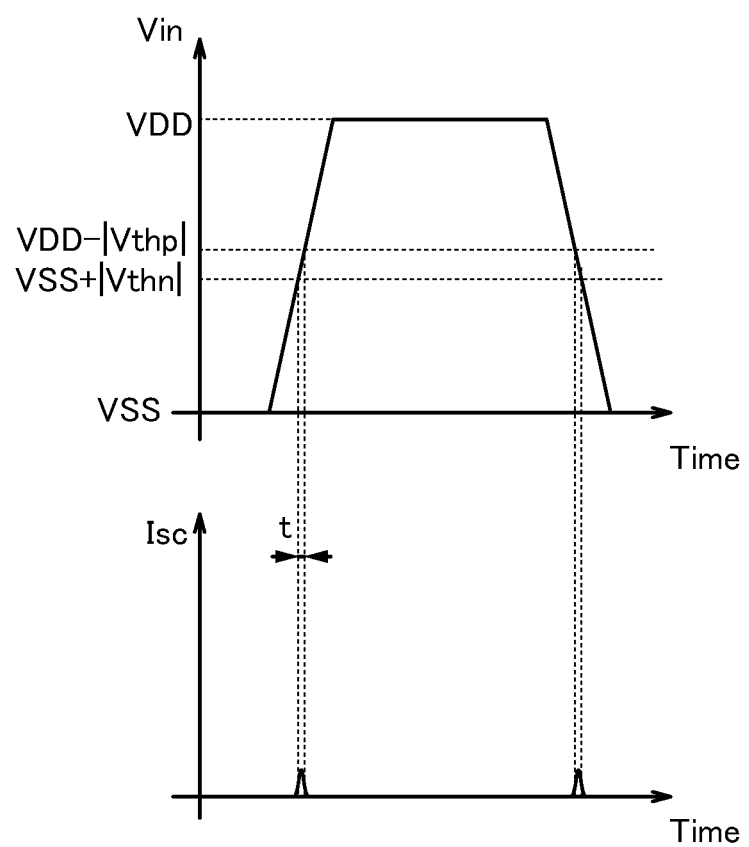
FIG. 5 is a diagram showing a structure example of a semiconductor device.

FIG. 5 shows an example of a timing chart for the potential Vin which is completely shifted from a low level to a high level and then shifted from a high level to a low level. FIG. 5 also shows an example of a change of through current Isc over time, which flows through the p-channel transistor 103 and the n-channel transistor 104. Note that the timing chart for the potential Vin accords with the change of the through current Isc over time in terms of a time axis.

In the timing chart for the potential Vin in FIG. 5, the potential Vin varies from the low-level potential VSS to the high-level potential VDD over a predetermined time. In addition, the potential Vin varies from the high-level potential VDD to the low-level potential VSS over a predetermined time.

In the case where the potential Vin varies as shown in FIG. 5, both the p-channel transistor 103 and the n-channel transistor 104 are on during a period t in which the potential Vin is within the range of VSS+|Vthn|≤Vin≤VDD"|Vthp|. The absolute value of the threshold voltage Vthp and the absolute value of the threshold voltage Vthn are large in FIG. 5; thus, the period t during which the potential Vin is within the range of VSS+|Vthn|≤Vin≤VDD−|Vthp| can be shortened. That is, the period t during which both the p-channel transistor 103 and the re-channel transistor 104 are on can be extremely short.

Figure 6A:
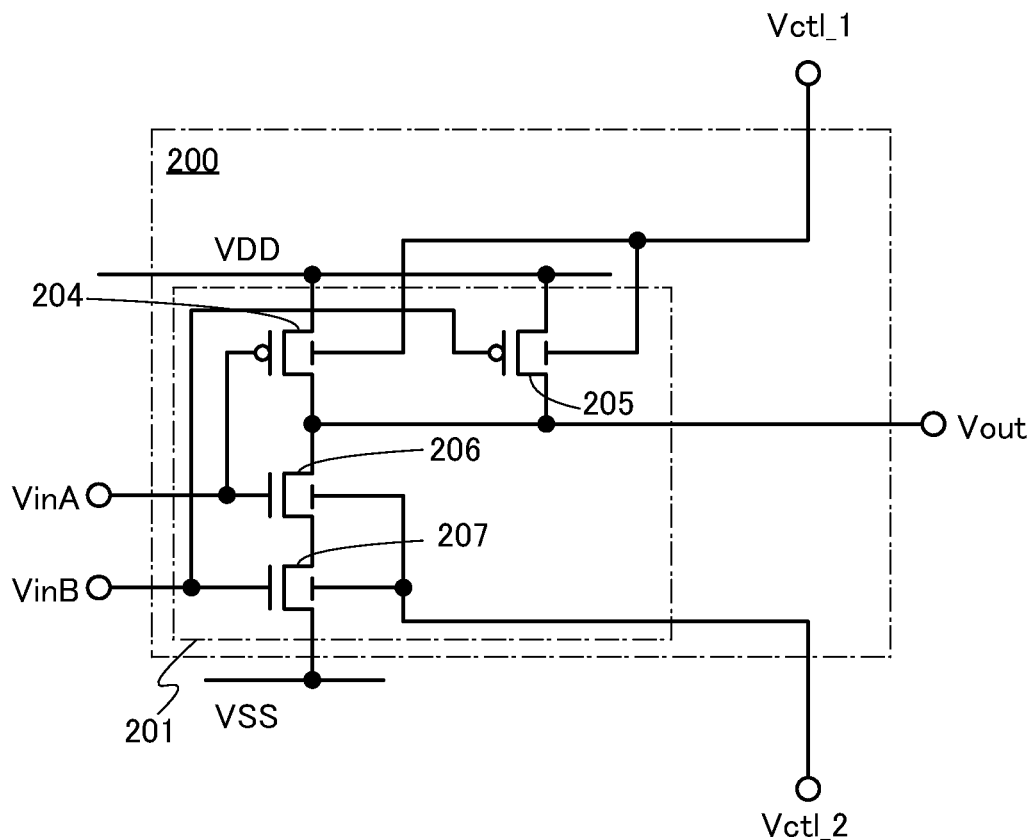
FIG. 6A and FIG. 6B are diagrams illustrating a structure example of a semiconductor device.

FIG. 6A is a diagram illustrating a semiconductor device 200 including a logic portion 201 functioning as a NAND circuit as a structure example of a logic circuit applicable to FIG. 1A.

The semiconductor device 200 illustrated in FIG. 6A includes the logic portion 201 that performs logic operation. The logic portion 201 includes a p-channel transistor 204, a p-channel transistor 205, an n-channel transistor 206, and an n-channel transistor 207. In FIG. 6A, the transistors are each provided with a back gate electrode for controlling threshold voltage, in addition to a normal gate electrode.

The potential Vctl_1 is supplied to the back gate electrodes of the p-channel transistor 204 and the p-channel transistor 205. The potential Vctl_2 is supplied to the back gate electrodes of the n-channel transistor 206 and the n-channel transistor 207.

Figure 6B:
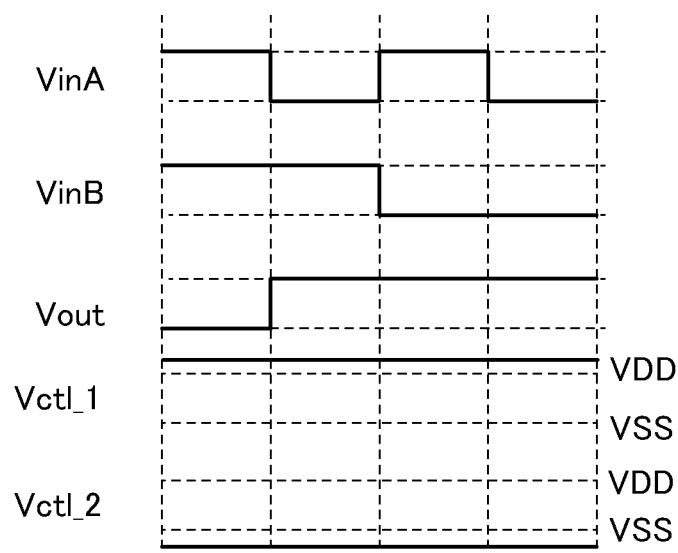

FIG. 6B shows an example of an ideal timing chart for the potentials VinA and VinB of the input signals and the potential Vout of the output signal in the semiconductor device 200 illustrated in FIG. 6A. FIG. 6B shows the magnitude relationship between the potentials Vctl_1 and Vctl_2 and the potentials VDD and VSS.

Note that the timing chart in FIG. 6B shows a state where the potential VinA and the potential VinB change instantly. However, in practice, it slightly takes time until the potential VinA and the potential VinB are completely shifted from a low level to a high level or from a high level to a low level. During the period in which the potentials are shifted, through current is likely to flow.

In one embodiment of the present invention, the threshold voltage of the p-channel transistor 204 is VthpA and the threshold voltage of the n-channel transistor 206 is VthnA. When the potential Vctl_1 is set high and the potential Vctl_2 is set low to increase the absolute value of the threshold voltage VthpA and the absolute value of the threshold voltage VthnA, a period during which the potential VinA is within the range of VSS+|VthnA|≤VinA≤VDD−|VthpA| can be shortened. That is, the period during which both the p-channel transistor 204 and the n-channel transistor 206 are on can be shortened. Thus, the through current generated during the period can be reduced.

Therefore, in the semiconductor device of one embodiment of the present invention, through current can be reduced; thus, power consumption can be suppressed. Alternatively, in the semiconductor device of one embodiment of the present invention, through current can be reduced; thus, heat generation can be suppressed and the reliability of the semiconductor device can be improved.

Figure 7A:
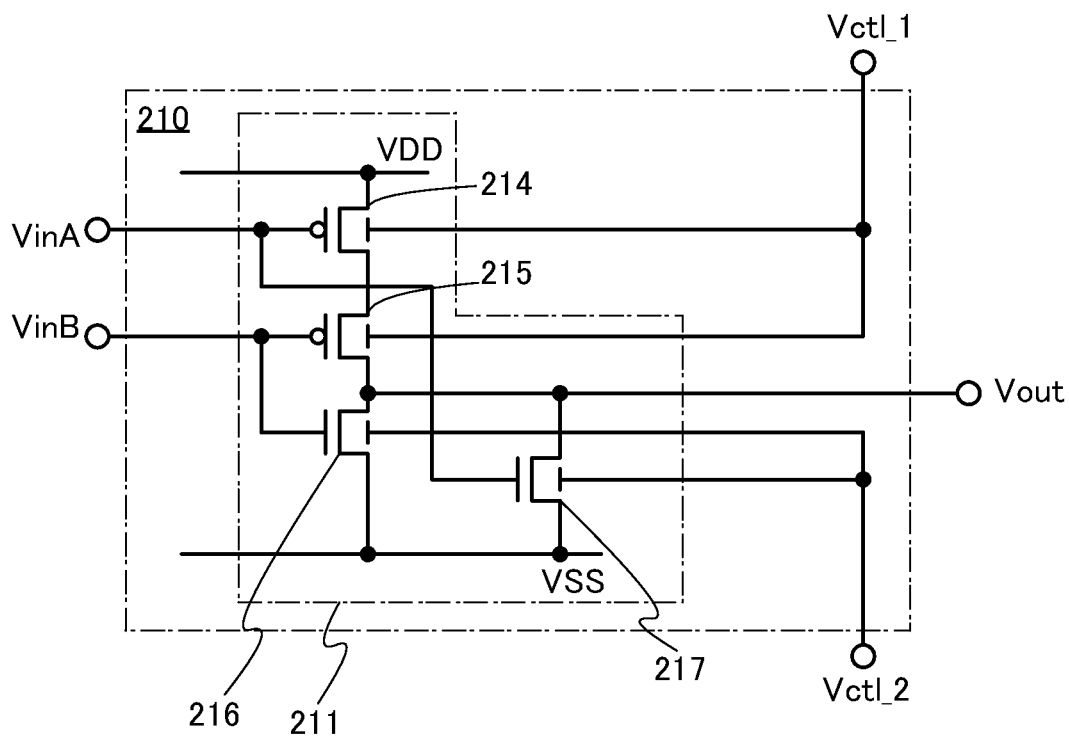
FIG. 7A and FIG. 7B are diagrams illustrating a structure example of a semiconductor device.

FIG. 7A is a diagram illustrating a semiconductor device 210 including the logic portion 201 functioning as a NOR circuit as a structure example of a logic circuit applicable to FIG. 1A.

The semiconductor device 200 illustrated in FIG. 7A includes a logic portion 211 that performs logic operation. The logic portion 211 includes a p-channel transistor 214, a p-channel transistor 215, an n-channel transistor 216, and an n-channel transistor 217. In FIG. 7A, the transistors are each provided with a back gate electrode for controlling threshold voltage, in addition to a normal gate electrode.

The potential Vctl_1 is supplied to the back gate electrodes of the p-channel transistor 214 and the p-channel transistor 215. The potential Vctl_2 is supplied to the back gate electrodes of the n-channel transistor 216 and the n-channel transistor 217.

Figure 7B:
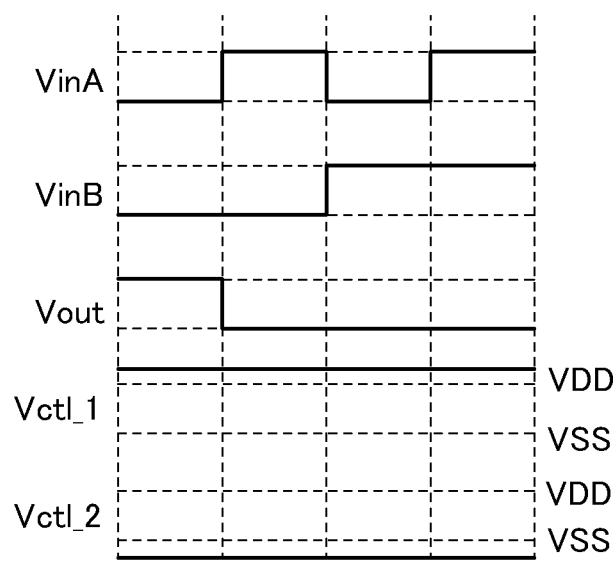

FIG. 7B shows an example of an ideal timing chart for the potentials VinA and VinB of the input signals and the potential Vout of the output signal in the semiconductor device 210 illustrated in FIG. 7A. FIG. 7B shows the magnitude relationship between the potentials Vctl_1 and Vctl_2 and the potentials VDD and VSS.

Note that the timing chart in FIG. 7B shows a state where the potential VinA and the potential VinB change instantly. However, in practice, it slightly takes time until the potential VinA and the potential VinB are completely shifted from a low level to a high level or from a high level to a low level. During the period in which the potentials are shifted, through current is likely to flow.

In one embodiment of the present invention, the threshold voltage of the p-channel transistor 214 is VthpA and the threshold voltage of the n-channel transistor 216 is VthnA. When the potential Vctl_1 is set high and the potential Vctl_2 is set low to increase the absolute value of the threshold voltage VthpA and the absolute value of the threshold voltage VthnA, a period during which the potential VinA is within the range of VSS+|VthnA|≤VinA≤VDD−|VthpA| can be shortened. That is, the period during which both the p-channel transistor 214 and the n-channel transistor 216 are on can be shortened. Thus, the through current generated during the period can be reduced.

Therefore, in the semiconductor device of one embodiment of the present invention, through current can be reduced; thus, power consumption can be suppressed. Alternatively, in the semiconductor device of one embodiment of the present invention, through current can be reduced; thus, heat generation can be suppressed and the reliability of the semiconductor device can be improved.

Figure 8:
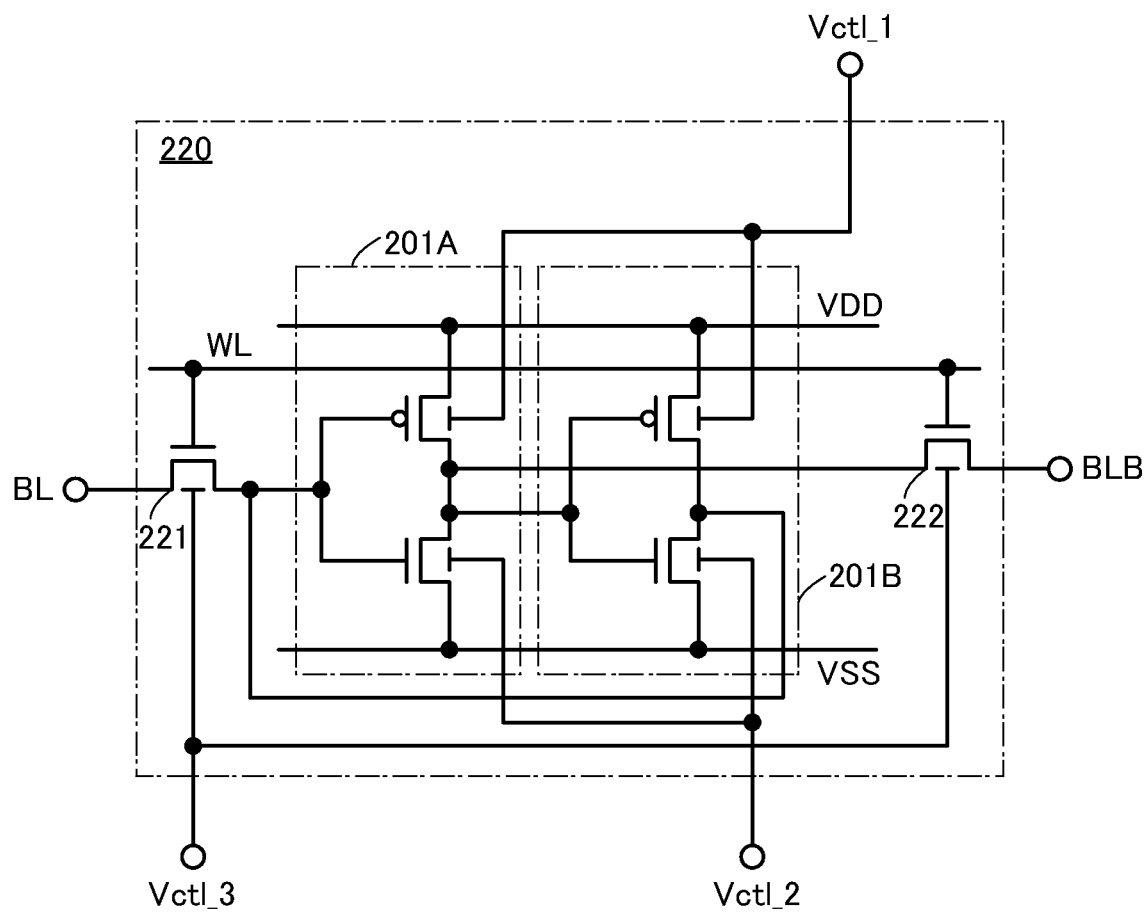
FIG. 8 is a diagram illustrating a structure example of a semiconductor device.

FIG. 8 is a diagram illustrating a semiconductor device 220 functioning as a static RAM (SRAM) including logic portions 201A and 201B that function as the inverter circuit illustrated in FIG. 4A.

The semiconductor device 220 illustrated in FIG. 8 includes the logic portion 201A, the logic portion 201B, a transistor 221, and a transistor 222. The logic portion 201A and the logic portion 201B each have a structure similar to that of the logic portion 101C illustrated in FIG. 4A. The transistor 221 and the transistor 222 each function as a switching element whose conduction state is controlled by control of a word line WL. The transistor 221 controls the conduction state between a bit line BL and the logic portion 201A. The transistor 222 controls the conduction state between an inverted bit line BLB and an input terminal of the logic portion 201B.

In FIG. 8, the transistor 221 and the transistor 222 are n-channel transistors and their back gate electrodes are supplied with a potential Vctl_3 different from the potential Vctl_2. With this structure, the off-state current of the transistor 221 and the transistor 222 can be reduced.

In the semiconductor device of one embodiment of the present invention, through current can be reduced; thus, power consumption can be suppressed. Alternatively, in the semiconductor device of one embodiment of the present invention, through current can be reduced; thus, heat generation can be suppressed and the reliability of the semiconductor device can be improved.

Embodiment 2

In this embodiment, a method for manufacturing the semiconductor device of one embodiment of the present invention that includes the p-channel Si transistor provided over an SOI substrate and the n-channel OS transistor provided over a layer including the Si transistor will be described.

Figure 9A:
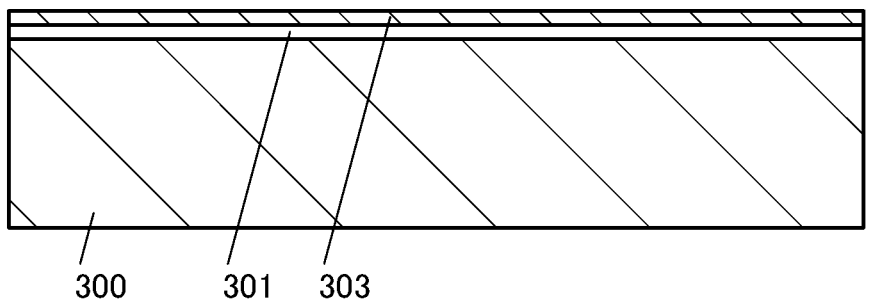
FIG. 9A to FIG. 9C are diagrams illustrating a structure example of a semiconductor device.

An SOI substrate including the silicon substrate 300, an insulating layer 301 formed over the silicon substrate 300, and a semiconductor layer 303 formed over the insulating layer 301 is prepared (FIG. 9A). The silicon substrate 300 is preferably a substrate formed of p-type or n-type single crystal silicon. The insulating layer 301 is, for example, a silicon oxide layer having a thickness of 10 nm to 50 nm. The insulating layer 301 is an insulating layer formed with a buried oxide. The semiconductor layer 303 is single crystal silicon formed by a SIMOX method, a Smart Cut method, or the like.

Figure 9B:
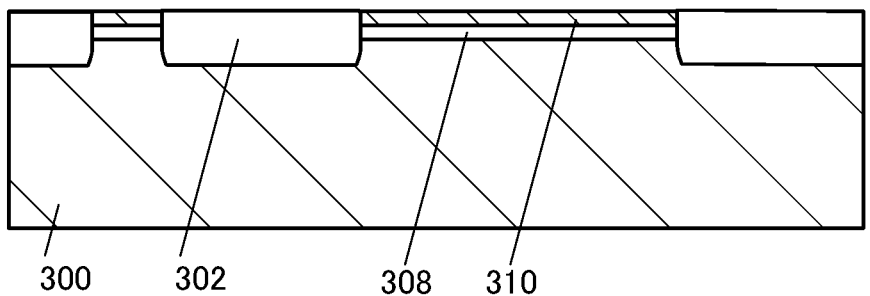

Next, in order to perform element isolation, an opening reaching the inside of the silicon substrate 300 is formed in the insulating layer 301 and the semiconductor layer 303, and then the opening is filled with an insulating layer 302 having a single layer or stacked layers of silicon oxide and silicon nitride (FIG. 9B). The insulating layer in a region other than the opening is selectively removed by a CMP (Chemical Mechanical Polishing) method or the like, whereby the insulating layer 302, a semiconductor layer 310, and the insulating layer 308 each having an island shape are formed as illustrated in FIG. 9B.

Figure 9C:
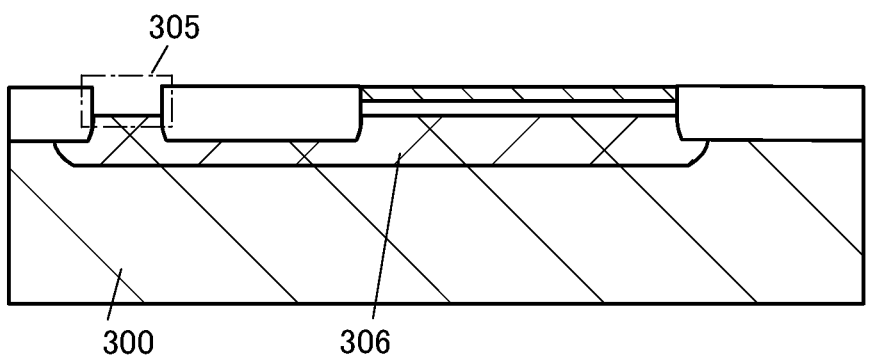

Next, parts of the semiconductor layer 310 and the insulating layer 308 are removed (a region 305 in FIG. 9C) to expose part of the silicon substrate 300. Then, an n-type impurity such as phosphorus (P) or arsenic (As) is injected into the silicon substrate by ion implantation to form the n-type well region 306 (FIG. 9C). Note that the formation process of the well region 306 may be performed before the removal of the semiconductor layer 310 and the insulating layer 308 in the region 305. The well region 306 functions as the back gate electrode of the p-channel transistor 103.

Figure 10A:
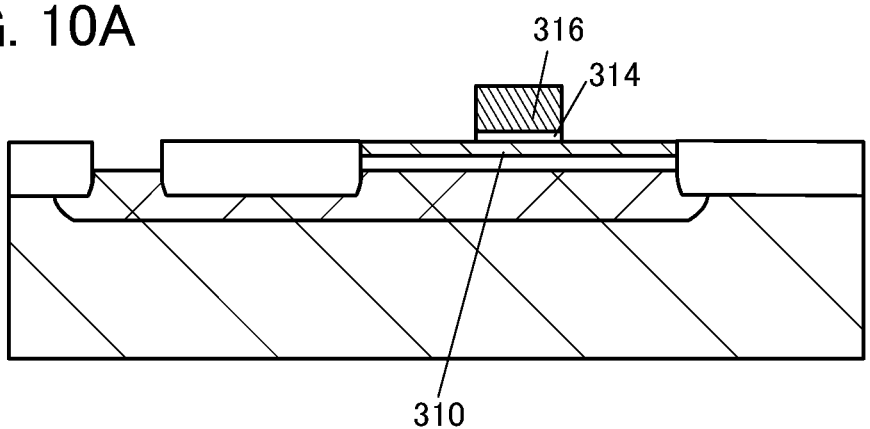
FIG. 10A to FIG. 10C are diagrams illustrating a structure example of a semiconductor device.

Next, the insulating layer 314 is formed over the semiconductor layer 310. The conductive layer 316 is formed over the insulating layer 314 (FIG. 10A). The insulating layer 314 functions as a gate insulating film. The insulating layer 314 is, for example, a silicon oxide layer having a thickness of 1 nm to 10 nm. The conductive layer 316 functions as the gate electrode of the p-channel transistor 103. The conductive layer 316 is, for example, polycrystalline silicon having a thickness of 40 nm to 200 nm.

Figure 10B:
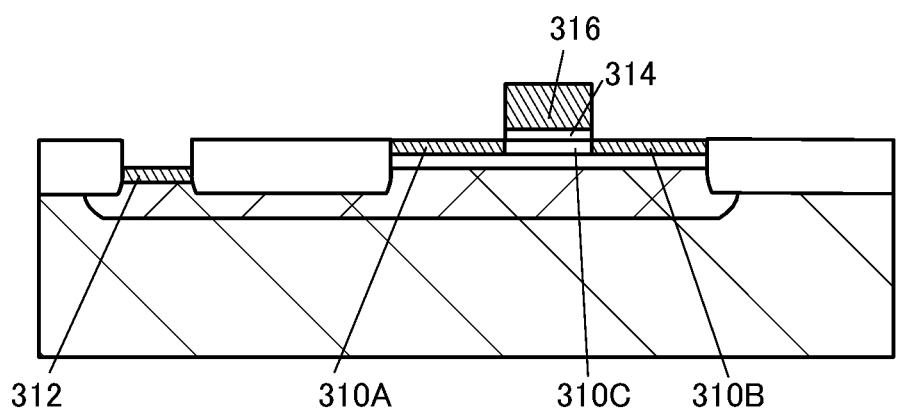

Next, an impurity that imparts p-type conductivity, such as boron (B), is introduced to the semiconductor layer 310 to form the impurity region 310A and the impurity region 310B (FIG. 10B). The impurity is not introduced to the semiconductor layer directly under the insulating layer 314 and the conductive layer 316; thus, the semiconductor layer becomes the channel formation region 310C. The impurity is also introduced to the silicon substrate exposed in the region 305 in FIG. 9C, so that an impurity region 312 is formed (FIG. 10B).

Figure 10C:
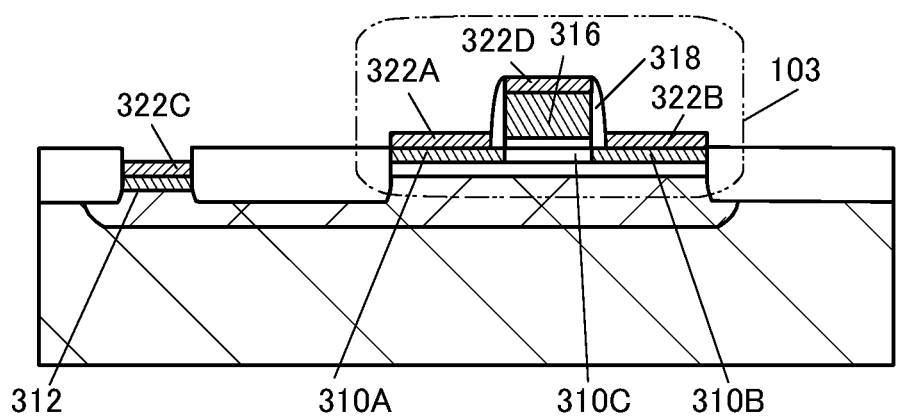

Next, the insulating layer 318 is formed on the side surfaces of the insulating layer 314 and the conductive layer 316. The insulating layer 318 can be formed in such a manner that an insulating film to be the insulating layer 318 is formed and then the insulating film is subjected to anisotropic dry etching or the like. The insulating layer 318 functions as a sidewall insulating layer (a sidewall spacer). As the insulating layer 318, silicon oxide, silicon nitride, stacked layers of silicon oxide and silicon nitride, or the like can be used. Then, the conductive layers 322A to 322D are selectively formed on the top surfaces of the conductive layer 316, the impurity region 310A, the impurity region 310B, and the impurity region 312 (FIG. 10C). The conductive layers 322A to 322D are each a metal silicide layer of cobalt silicide, nickel silicide, nickel platinum silicide, or the like, for example. Through the above processes, the p-channel transistor 103 provided with the well region functioning as the back gate electrode can be formed in an FD-SOI (Fully-Depleted Silicon-ON-Insulator) that is a kind of completely depleted SOI (Silicon On Insulator).

Figure 11A:
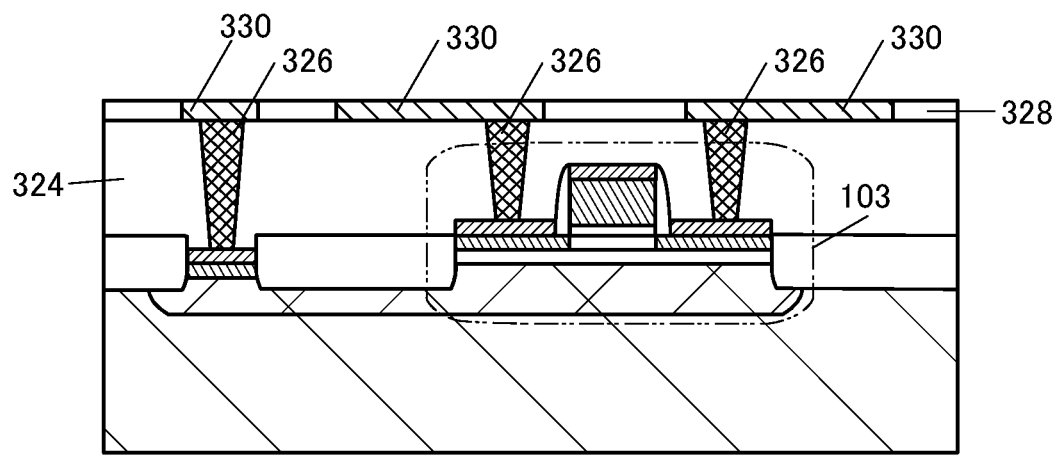
FIG. 11A and FIG. 11B are diagrams illustrating a structure example of a semiconductor device.

Next, the insulating layer 324 functioning as an interlayer insulating film is formed, a plurality of openings are formed in the insulating layer 324, and the conductive layers 326 functioning as plug electrodes are formed in the openings. Then, the insulating layer 328 functioning as an interlayer insulating film is formed over the insulating layer 324 in which the conductive layers 326 are buried. Wiring grooves are provided in the insulating layer 328, and then the conductive layers 330 functioning as wirings are formed in the wiring grooves (FIG. 11A).

Figure 11B:
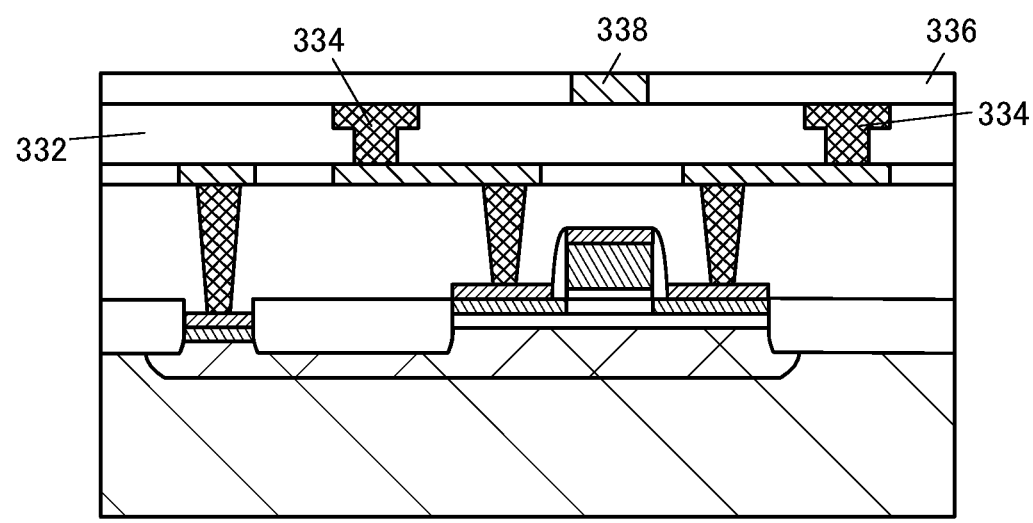

Next, the insulating layer 332 functioning as an interlayer insulating film is formed, a plurality of openings are formed in the insulating layer 332, and the conductive layers 334 functioning as plug electrodes or wirings are formed in the openings. A plurality of layers including an interlayer insulating film or a wiring may be stacked. The insulating layer 336 functioning as an interlayer insulating film is formed over the insulating layer 332 and the conductive layers 334. A wiring groove is provided in the insulating layer 336, and then the conductive layer 338 functioning as the back gate of the n-channel transistor is formed in the wiring groove (FIG. 11B).

For the insulating layer 324, the insulating layer 328, the insulating layer 332, and the insulating layer 336, silicon oxide, silicon oxynitride, silicon nitride oxide, silicon nitride, aluminum oxide, aluminum oxynitride, aluminum nitride oxide, aluminum nitride, or the like is used, for example.

Note that in this specification, silicon oxynitride refers to a material that contains oxygen at a higher proportion than nitrogen, and silicon nitride oxide refers to a material that contains nitrogen at a higher proportion than oxygen. Furthermore, in this specification, aluminum oxynitride refers to a material that contains oxygen at a higher proportion than nitrogen, and aluminum nitride oxide refers to a material that contains nitrogen at a higher proportion than oxygen.

In addition, for the insulating layer 332, it is preferable to use a film having a barrier property that prevents diffusion of hydrogen or impurities from the silicon substrate 300, the p-channel transistor 103, or the like into a region where the n-channel transistor 104 is provided.

For the film having a barrier property against hydrogen, silicon nitride formed by a CVD method can be used, for example. Here, hydrogen diffusion to a semiconductor element including an oxide semiconductor, such as the n-channel transistor 104, degrades the characteristics of the semiconductor element in some cases. Therefore, a film that inhibits hydrogen diffusion is preferably provided between the p-channel transistor 103 and the n-channel transistor 104. The film that inhibits hydrogen diffusion is specifically a film from which a small amount of hydrogen is released.

As a material for the conductive layer 326, the conductive layer 330, the conductive layer 334, and the conductive layer 338, a conductive material such as a metal material, an alloy material, a metal nitride material, or a metal oxide material can be used as a single layer or stacked layers. It is preferable to use a high-melting-point material that has both heat resistance and conductivity, such as tungsten or molybdenum, and it is preferable to use tungsten. Alternatively, it is preferable to use a low-resistance conductive material such as aluminum or copper. The use of a low-resistance conductive material can reduce wiring resistance.

Figure 12A:
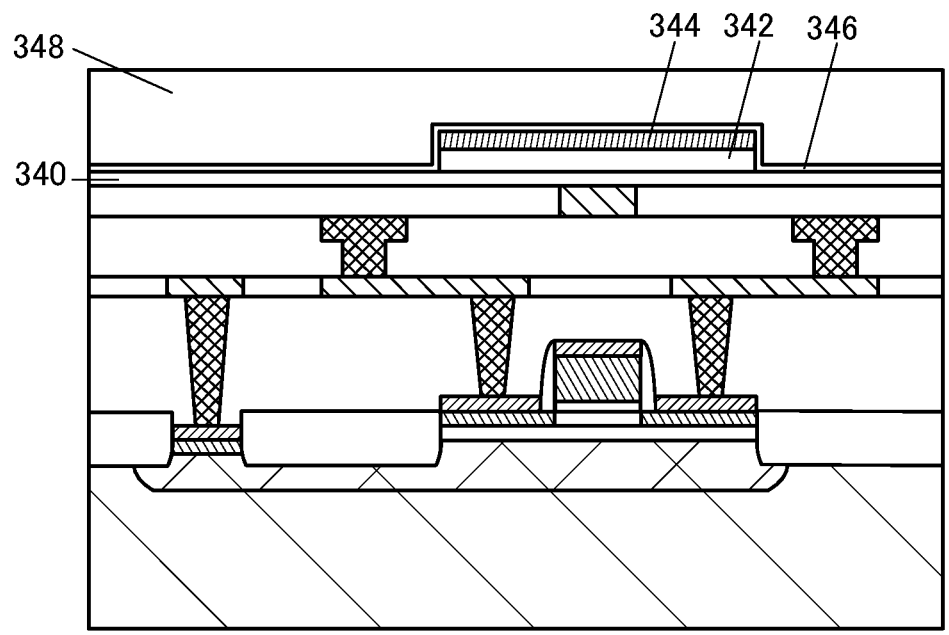
FIG. 12A and FIG. 12B are diagrams illustrating a structure example of a semiconductor device.

Next, the insulating layer 340 is formed over the insulating layer 336 and the conductive layer 338. Over the insulating layer 340, the semiconductor layer 342 and the conductive layer 344 are each formed to have an island shape, and then the insulating layer 346 and the insulating layer 348 are formed (FIG. 12A).

It is preferable to use, for the insulating layer 340, an insulator containing more oxygen than oxygen in the stoichiometric composition. Such oxygen is easily released from the film by heating. In this specification and the like, oxygen released by heating is sometimes referred to as "excess oxygen". That is, a region containing excess oxygen (also referred to as an "excess-oxygen region") is preferably formed in the insulating layer 340. When such an insulator containing excess oxygen is provided in contact with the semiconductor layer 342, oxygen vacancies ($V_O$) in the semiconductor layer 342 can be reduced and the reliability of the n-channel transistor 104 can be improved. When hydrogen enters the oxygen vacancies in the semiconductor layer 342, such defects (hereinafter, sometimes referred to as $V_OH$) function as donors and generate electrons serving as carriers in some cases. In other cases, bonding of part of hydrogen to oxygen bonded to a metal atom generates electrons serving as carriers. Thus, a transistor including an oxide semiconductor that contains a large amount of hydrogen is likely to have normally-on characteristics. Moreover, hydrogen in an oxide semiconductor is easily transferred by a stress such as heat or an electric field; thus, a large amount of hydrogen in an oxide semiconductor might reduce the reliability of the transistor. In one embodiment of the present invention, $V_OH$ in the semiconductor layer 342 is preferably reduced as much as possible so that the semiconductor layer 342 becomes a highly purified intrinsic or substantially highly purified intrinsic oxide. It is important to remove impurities such as moisture or hydrogen in an oxide semiconductor (sometimes described as "dehydration" or "dehydrogenation treatment") and to compensate for oxygen vacancies by supplying oxygen to the oxide semiconductor (sometimes described as "oxygen adding treatment") in order to obtain an oxide semiconductor whose $V_OH$ is sufficiently reduced. When an oxide semiconductor with sufficiently reduced impurities such as $V_OH$ is used for a channel formation region of a transistor, the transistor can have stable electrical characteristics.

As the insulator including an excess-oxygen region, specifically, an oxide material that releases part of oxygen by heating is preferably used. An oxide that releases oxygen by heating is an oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in TDS (Thermal Desorption Spectroscopy) analysis. Note that the temperature of the film surface in the TDS analysis is preferably within the range of 100° C. to 700° C., or 100° C. to 400° C.

One or more of heat treatment, microwave treatment, and RF treatment may be performed in a state in which the insulator including the excess-oxygen region and the semiconductor layer 342 are in contact with each other. By the treatment, water or hydrogen in the semiconductor layer 342 can be removed. For example, in the semiconductor layer 342, dehydrogenation can be performed when a reaction in which a bond of $V_OH$ is cut occurs, i.e., a reaction of "$V_OH \rightarrow V_O + H$" occurs. Part of hydrogen generated at this time is bonded to oxygen to be $H_2O$, and removed from the semiconductor layer 342 or an insulator in the vicinity of the semiconductor layer 342 in some cases. Part of hydrogen may be gettered by the conductive layer 344 in some cases.

For the microwave treatment, for example, an apparatus including a power source that generates high-density plasma or an apparatus including a power source that applies RF to the substrate side is suitably used. For example, the use of an oxygen-containing gas and high-density plasma enables high-density oxygen radicals to be generated, and application of the RF to the substrate side allows the oxygen radicals generated by the high-density plasma to be efficiently introduced into the semiconductor layer 342 or an insulator in the vicinity of the semiconductor layer 342. The pressure in the microwave treatment is higher than or equal to 133 Pa, preferably higher than or equal to 200 Pa, further preferably higher than or equal to 400 Pa. As a gas introduced into an apparatus for performing the microwave treatment, for example, oxygen and argon are used and the oxygen flow rate ($O_2/(O_2+Ar)$) is lower than or equal to 50%, preferably higher than or equal to 10% and lower than or equal to 30%.

The semiconductor layer 342 is formed by stacking two, or three or more oxides with different atomic ratios of metal atoms, so that a highly reliable semiconductor device can be obtained. The metal oxide functioning as an oxide semiconductor may be formed by a sputtering method or an ALD (Atomic Layer Deposition) method.

A metal oxide used for an OS transistor is a Zn oxide, a Zn—Sn oxide, a Ga—Sn oxide, an In—Ga oxide, an In—Zn oxide, an In-M-Zn oxide (M is one or more metals selected from Ti, Ga, Y, Zr, La, Ce, Nd, Sn, and Hf), or the like. The use of a metal oxide containing Ga as M for the OS transistor is particularly preferable because the electrical characteristics such as field-effect mobility of the transistor can be made excellent by adjusting a ratio of elements. In addition, an oxide containing indium and zinc may contain one or more kinds selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like.

In order to improve the reliability and electrical characteristics of the OS transistor, it is preferable that the metal oxide used in the semiconductor layer be a metal oxide having a crystal part, such as CAAC-OS, CAC-OS, or nc-OS. CAAC-OS is an abbreviation for c-axis-aligned crystalline oxide semiconductor. CAC-OS is an abbreviation for Cloud-Aligned Composite oxide semiconductor. In addition, nc-OS is an abbreviation for nanocrystalline oxide semiconductor.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The CAC-OS has a function of allowing electrons (or holes) serving as carriers to flow and a function of not allowing electrons serving as carriers to flow. The function of allowing electrons to flow and the function of not allowing electrons to flow are separated, whereby both functions can be heightened to the maximum. In other words, when CAC-OS is used for a channel formation region of an OS transistor, a high on-state current and an extremely low off-state current can be both achieved.

Avalanche breakdown or the like is less likely to occur in some cases in an OS transistor than in a general Si transistor because, for example, a metal oxide has a wide band gap and thus electrons are less likely to be excited, and the effective mass of a hole is large. Therefore, for example, it may be possible to inhibit hot-carrier degradation or the like that is caused by avalanche breakdown. Since hot-carrier degradation can be inhibited, an OS transistor can be driven with a high drain voltage.

For the conductive layer 344, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements as its component; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. In addition, tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are conductive materials that are not easily oxidized or materials that retain their conductivity even after absorbing oxygen. Furthermore, a metal nitride film of tantalum nitride or the like is preferable because it has a barrier property against hydrogen or oxygen.

The conductive layer 344 has a single-layer structure in the diagram, but may have a stacked-layer structure of two or more layers. For example, it is preferable to stack a tantalum nitride film and a tungsten film. Alternatively, a titanium film and an aluminum film may be stacked. Alternatively, a two-layer structure in which an aluminum film is stacked over a tungsten film, a two-layer structure in which a copper film is stacked over a copper-magnesium-aluminum alloy film, a two-layer structure in which a copper film is stacked over a titanium film, or a two-layer structure in which a copper film is stacked over a tungsten film may be employed.

Other examples include a three-layer structure where a titanium film or a titanium nitride film is formed, an aluminum film or a copper film is stacked over the titanium film or the titanium nitride film, and a titanium film or a titanium nitride film is formed thereover; and a three-layer structure where a molybdenum film or a molybdenum nitride film is formed, an aluminum film or a copper film is stacked over the molybdenum film or the molybdenum nitride film, and a molybdenum film or a molybdenum nitride film is formed thereover. Note that a transparent conductive material containing indium oxide, tin oxide, or zinc oxide may be used.

The insulating layer 348 is provided to cover the conductive layer 344 and the semiconductor layer 342 and inhibits oxidation of the conductive layer 344.

A metal oxide containing one kind or two or more kinds selected from hafnium, aluminum, gallium, yttrium, zirconium, tungsten, titanium, tantalum, nickel, germanium, neodymium, lanthanum, magnesium, and the like can be used for the insulating layer 348. Alternatively, silicon nitride oxide, silicon nitride, or the like can be used for the insulating layer 348.

It is particularly preferable to use an insulator containing an oxide of one or both of aluminum and hafnium, such as aluminum oxide, hafnium oxide, or an oxide containing aluminum and hafnium (hafnium aluminate), as the insulating layer 348. In particular, hafnium aluminate has higher heat resistance than a hafnium oxide film. Therefore, hafnium aluminate is preferable because it is unlikely to be crystallized by heat treatment in a later step.

Next, parts of the conductive layer 344, the insulating layer 346, and the insulating layer 348 are removed to form an opening at which part of the semiconductor layer 342 is exposed. The conductive layer 344 over the semiconductor layer 342 is divided by the formation of the opening, and the conductive layer 344A and the conductive layer 344B functioning as a source electrode and a drain electrode are formed. Then, the insulating layer 350 and the conductive layer 352 are formed in the opening.

The insulating layer 350 functions as a gate insulating film. Like the insulating layer 340, the insulating layer 350 is preferably formed using an insulator that contains excess oxygen and releases oxygen by heating.

To efficiently supply excess oxygen in the insulating layer 350 to the semiconductor layer 342, a metal oxide may be provided between the insulating layer 350 and the conductive layer 352. Providing the metal oxide inhibits diffusion of excess oxygen from the insulating layer 350 to the conductive layer 352. That is, a reduction in the amount of excess oxygen that is supplied to the semiconductor layer 342 can be inhibited.

Note that the insulating layer 350 may have a stacked-layer structure. As miniaturization and high integration of transistors progress, a problem such as leakage current might arise because of a thinner gate insulating film. For that reason, when the insulator functioning as the gate insulating film has a stacked-layer structure of a high-k material and a thermally stable material, a gate potential during transistor operation can be reduced while the physical thickness is maintained. Furthermore, the stacked-layer structure can be thermally stable and have a high relative permittivity.

The conductive layer 352 functioning as the gate electrode may have a single-layer structure or a stacked-layer structure of two or more layers.

For the conductive layer 352, a conductive material containing tungsten, copper, or aluminum as its main component is preferably used. The conductive layer 352 also functions as a wiring and thus is preferably formed using a conductor having high conductivity. For example, a conductive material containing tungsten, copper, or aluminum as its main component can be used. The conductive layer 352 may have a stacked-layer structure; for example, a stacked-layer structure including a conductive material having a function of inhibiting impurity diffusion, such as tantalum, tantalum nitride, ruthenium, or ruthenium oxide, may be employed.

As in the insulating layer 340 and the like, the concentration of impurities such as water and hydrogen in the insulating layer 348 is preferably reduced.

Figure 12B:
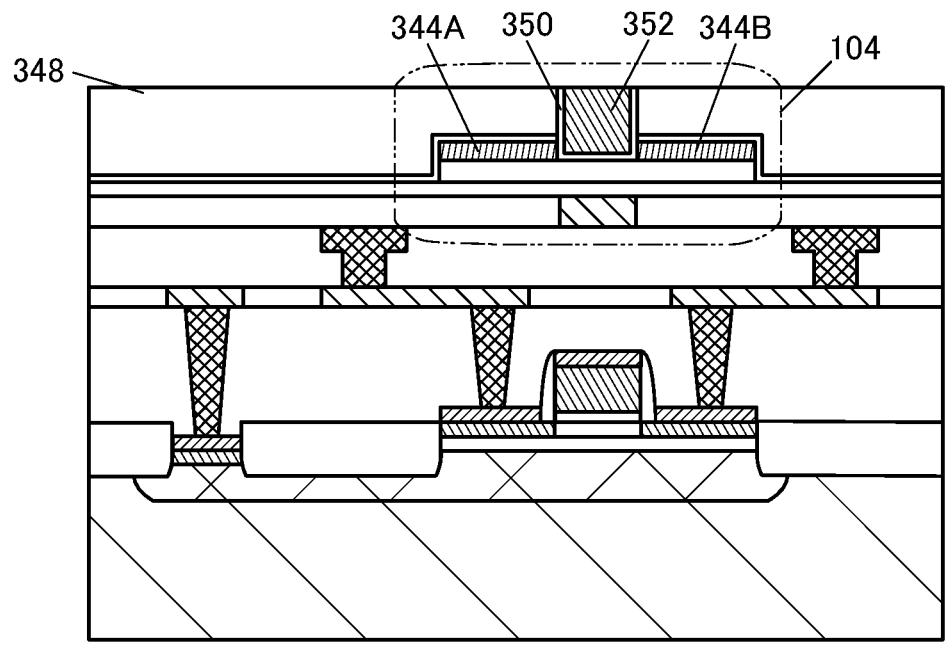

Through the above processes, the n-channel transistor 104 can be formed (FIG. 12B).

Figure 13A:
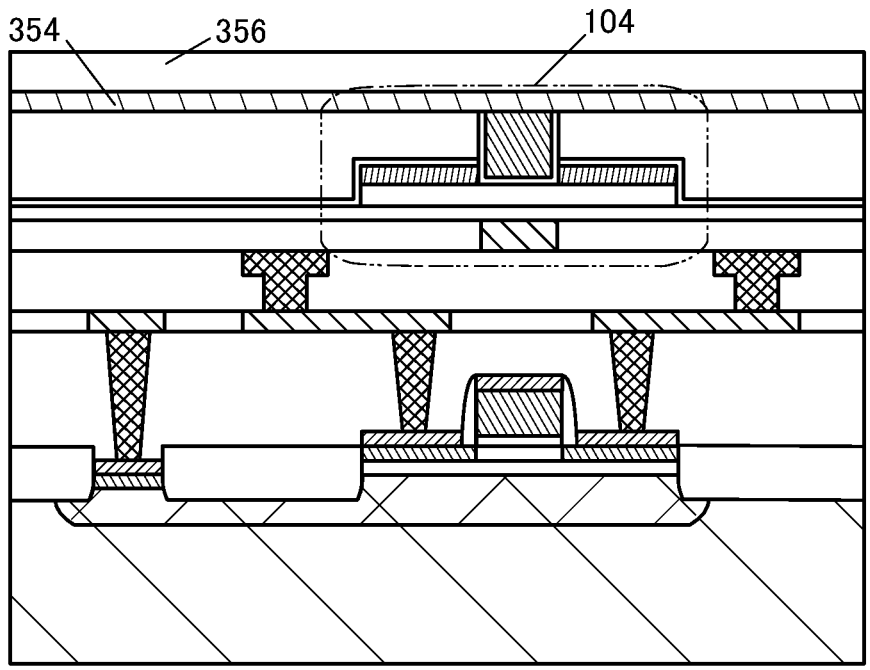
FIG. 13A and FIG. 13B are diagrams illustrating a structure example of a semiconductor device.

Next, the insulating layer 354 and the insulating layer 356 are formed over the n-channel transistor 104 and the insulating layer 348 (FIG. 13A).

A substance having a barrier property against oxygen or hydrogen is preferably used for the insulating layer 354. For the insulating layer 354, a metal oxide such as aluminum oxide, hafnium oxide, or tantalum oxide can be used, for example.

When a material with a comparatively low dielectric constant is used for the insulating layer 356, parasitic capacitance between wirings can be reduced. A silicon oxide film, a silicon oxynitride film, or the like can be used for the insulating layer 356, for example.

Figure 13B:
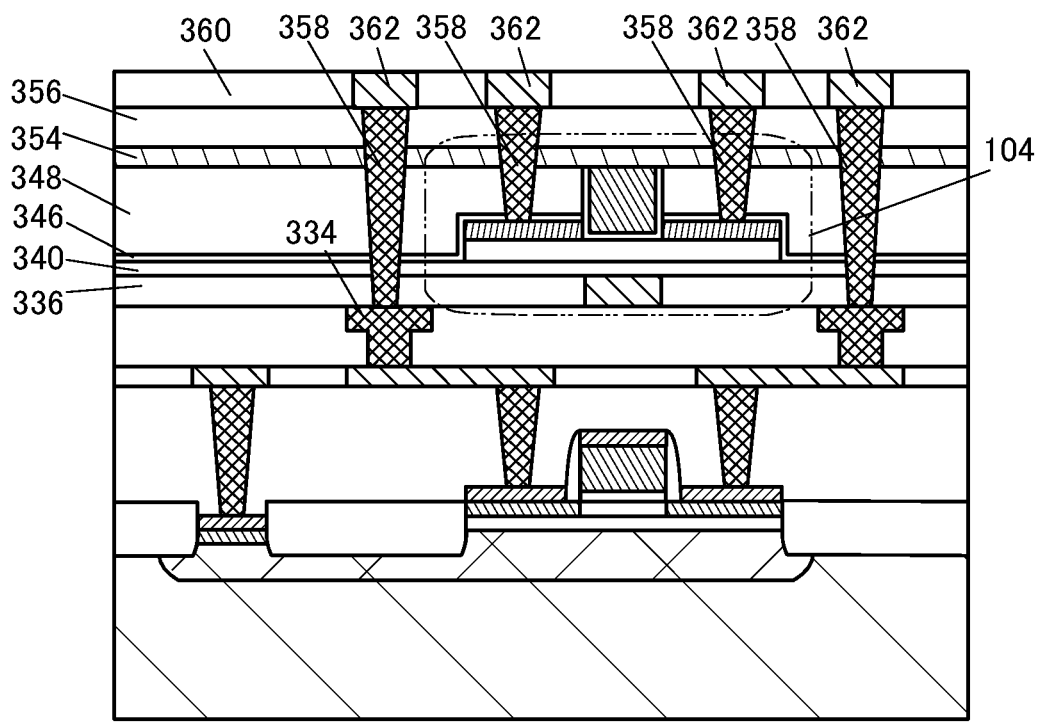

Next, parts of the insulating layer 336, the insulating layer 340, the insulating layer 346, the insulating layer 348, the insulating layer 354, and the insulating layer 356 are removed to form openings at which parts of the conductive layer 334, the conductive layer 344A, and the conductive layer 344 are exposed. The conductive layers 358 functioning as plug electrodes are formed in the openings. Then, the insulating layer 360 functioning as an interlayer insulating film is formed over the insulating layer 356 in which the conductive layers 358 are buried. Wiring grooves are provided in the insulating layer 360, and then the conductive layers 362 functioning as wirings are formed in the wiring grooves (FIG. 13B).

The conductive layer 358 can be formed using a material similar to that for the conductive layer 326 or the like. The conductive layer 362 can be formed using a material similar to that for the conductive layer 330 or the like. The conductive layer 362 is electrically connected to wirings for supplying the potential VDD, the potential VSS, and the like or the wirings.

As described above, one embodiment of the present invention can provide the semiconductor device that is downsized by stacking the p-channel Si transistor and the n-channel OS transistor. Another embodiment of the present invention can provide the semiconductor device with reduced power consumption in which both the n-channel transistor and the p-channel transistor are provided with the back gate electrodes for controlling their threshold voltages. Another embodiment of the present invention can provide a semiconductor device having a novel structure.

Embodiment 3

In this embodiment, a structure including a CPU and an accelerator will be described as an application example of the semiconductor device 100 described in the above embodiment.

Figure 14:
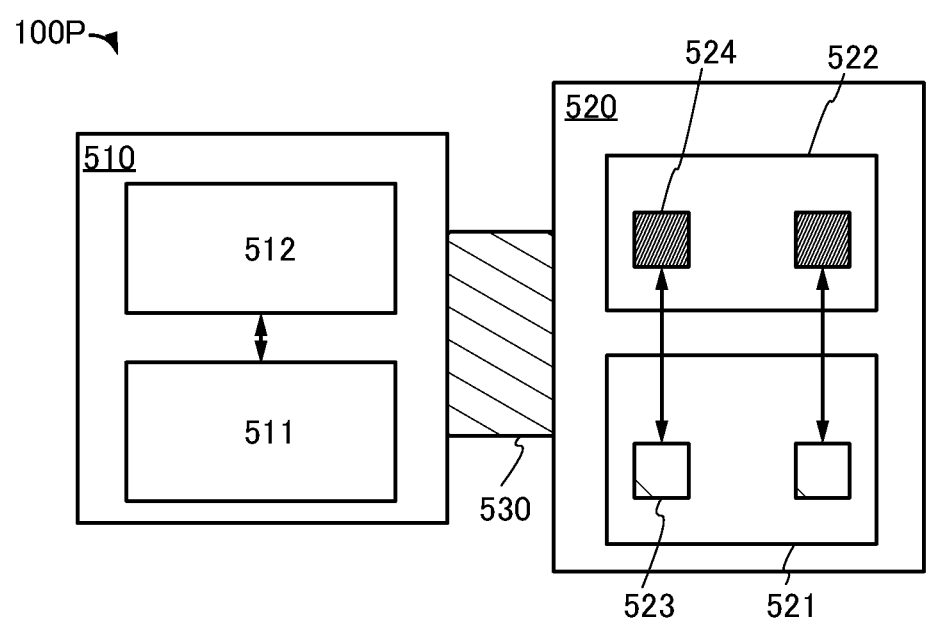
FIG. 14 is a diagram illustrating a structure example of a semiconductor device.

FIG. 14 is a diagram for describing a semiconductor device 100P including a CPU and an accelerator. The semiconductor device 100P in FIG. 14 includes a CPU 510, an accelerator 520, and a bus 530, for example. The CPU 510 includes a CPU core 511 and a backup circuit 512. The accelerator 520 includes an arithmetic processing portion 521 and a memory portion 522. The arithmetic processing portion 521 includes an arithmetic circuit 523. The memory portion 522 includes a memory circuit 524. The memory portion 522 is referred to as a device memory or a shared memory in some cases.

The CPU 510 has a function of performing general-purpose processing such as execution of an operating system, control of data, and execution of various arithmetic operations and programs. The CPU 510 includes the CPU core 511. The CPU core 511 corresponds to one or a plurality of CPU cores. The CPU 510 includes the backup circuit 512 that can retain data stored in the CPU core 511 even when the supply of power supply voltage is stopped. The supply of power supply voltage can be controlled by electric isolation by a power switch or the like from a power domain. Note that power supply voltage is referred to as drive voltage in some cases. As the backup circuit 512, a memory including an OS transistor is suitable.

The backup circuit 512 formed using an OS transistor can be stacked over the CPU core 511 that can be formed using a transistor containing silicon in a channel formation region (a Si transistor). The area of the backup circuit 512 is smaller than the area of the CPU core 511; thus, the backup circuit 512 can be provided over the CPU core without an increase in the circuit area. The backup circuit 512 has a function of retaining data of a register included in the CPU core 511. The backup circuit 512 is also referred to as a data retention circuit.

The accelerator 520 has a function of executing a program (also referred to as kernel or a kernel program) called from a host program. The accelerator 520 can perform parallel processing of matrix operation in graphics processing, parallel processing of product-sum operation of a neural network, and parallel processing of floating-point operation in a scientific computation, for example.

The memory portion 522 has a function of storing data to be processed by the accelerator 520. Specifically, weight data used in the parallel processing of product-sum operation of a neural network can be stored. The memory circuit 524 included in the memory portion 522 has a function of retaining binary data, i.e., 1-bit data. Note that without limitation on binary data, ternary or higher-level data can be retained.

A memory including an OS transistor (hereinafter, also referred to as an OS memory) is suitable for the memory circuit 524. The OS memory has a function of retaining electric charge corresponding to a voltage value when the OS transistor is turned off. The accelerator 520 can retain data owing to the memory circuit 524 that is an OS memory even when supply of power supply voltage is stopped. Thus, the power gating of the accelerator 520 is possible and power consumption can be reduced greatly.

The memory circuit 524 formed using an OS transistor can be stacked over the arithmetic circuit 523 that can be formed using a Si transistor. Consequently, the memory circuit 524 can be provided without an increase in the circuit area.

The memory circuit 524 preferably has a circuit structure of a NOSRAM. "NOSRAM (registered trademark)" is an abbreviation for "Nonvolatile Oxide Semiconductor RAM". A NOSRAM is a memory in which its memory cell is a 2-transistor (2T) or 3-transistor (3T) gain cell, and its access transistor is an OS transistor. An OS transistor has an extremely low current that flows between a source and a drain in an off state, that is, leakage current. The NOSRAM can be used as a nonvolatile memory by retaining electric charge corresponding to data in the memory circuit, using characteristics of an extremely low leakage current. In particular, the NOSRAM is capable of reading out retained data without destruction (non-destructive reading), and thus is suitable for parallel processing of product-sum operation of a neural network in which only data reading operation is repeated many times.

The arithmetic processing portion 521 has a function of performing arithmetic processing using a digital value. The digital value is unlikely to be affected by noise. Thus, the accelerator 520 is suitable for performing arithmetic processing that requires a highly accurate arithmetic result. Note that the arithmetic processing portion 521 is preferably formed using a Si transistor. With this structure, an OS transistor can be stacked.

The arithmetic circuit 523 has a function of performing any one of integer arithmetic operation, single precision floating-point arithmetic operation, double precision floating-point arithmetic operation, and the like. The arithmetic circuit 523 has a function of repeating the same processing such as product-sum operation.

Note that the arithmetic circuit 523 employs such a structure that one arithmetic circuit 523 is provided for every bit line of the memory circuit 524, i.e., for every one column (Column-Parallel Calculation). With this structure, data of one row (all bit lines at the maximum) of the memory circuit 524 can be subjected to arithmetic processing in parallel. As compared to product-sum operation using the CPU 510, there is no limitation on the data bus size (e.g., 32 bits) between the CPU and the memory, and thus the parallelism of arithmetic operation can be greatly increased in Column-Parallel Calculation. Accordingly, an arithmetic efficiency regarding an enormous amount of arithmetic processing such as learning of a deep neural network (deep learning) or a scientific computation that performs floating-point arithmetic operation, which is the AI technology, can be improved. Additionally, data output from the memory circuit 524 can be read out after completion of the arithmetic operation, whereby power required for memory access (data transfer between a CPU and a memory and arithmetic operation in a CPU) can be reduced and heat generation and an increase in power consumption can be suppressed. Furthermore, when the physical distance between the arithmetic circuit 523 and the memory circuit 524 is decreased; for example, when a wiring distance can be shortened by stacking layers, parasitic capacitance generated in a signal line can be reduced and low power consumption can be achieved.

The bus 530 electrically connects the CPU 510 to the accelerator 520. That is, data can be transferred between the CPU 510 and the accelerator 520 through the bus 530.

Next, an operation example of the case where the accelerator 520 executes part of arithmetic operation of a program executed by the CPU 510 is described.

Figure 15:
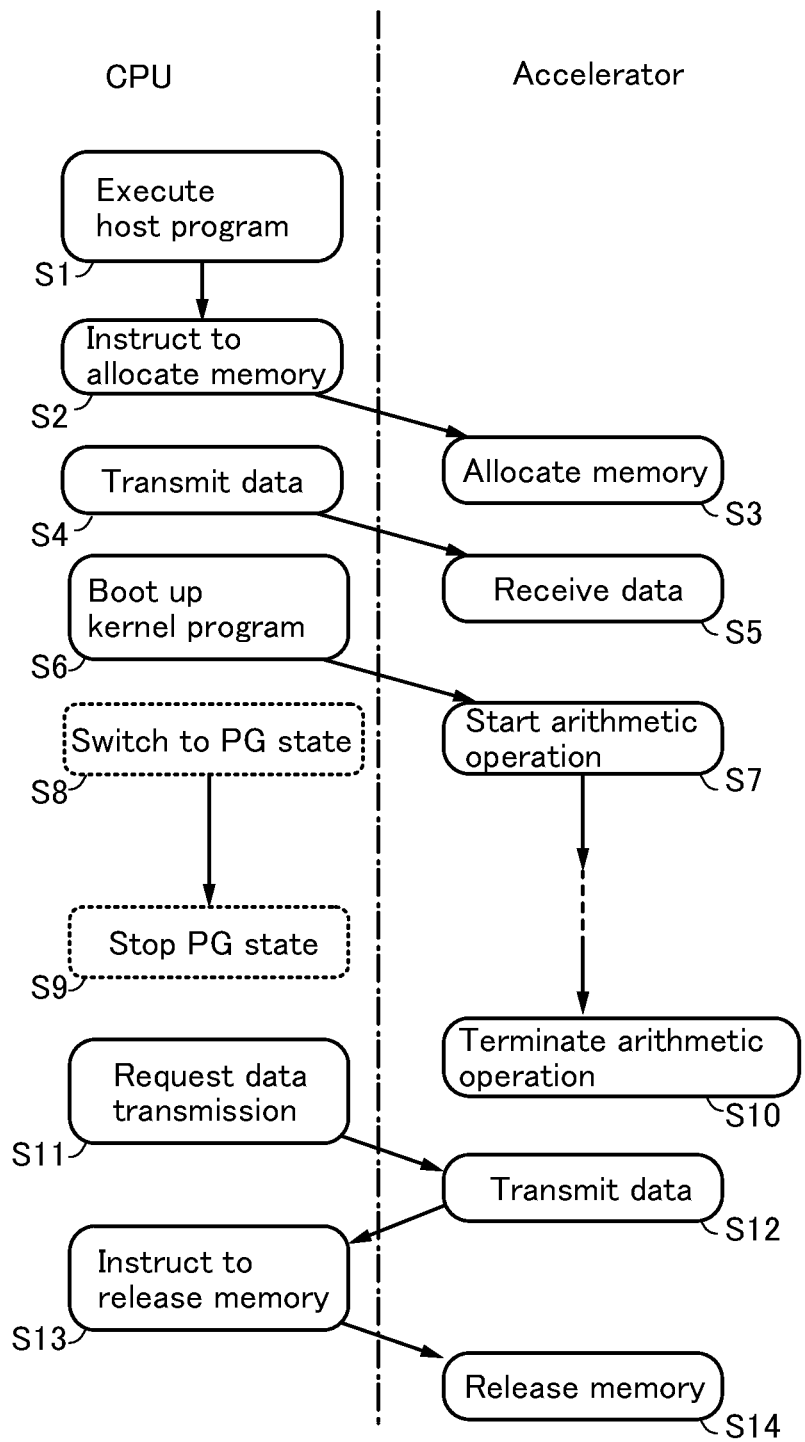
FIG. 15 is a diagram showing an operation example of a semiconductor device.

FIG. 15 shows an operation example of the case where the accelerator executes part of arithmetic operation of a program executed by the CPU.

The host program is executed by the CPU (Step S1).

In the case where the CPU confirms an instruction to allocate, to a memory portion, a region for data needed in performing arithmetic operation using the accelerator (Step S2), the CPU allocates the region for the data to the memory portion (Step S3).

Next, the CPU transmits input data from the main memory to the above-described memory portion (Step S4). The above-described memory portion receives the input data and stores the input data in the region allocated in Step S3 (Step S5).

In the case where the CPU confirms an instruction to boot up the kernel program (Step S6), the accelerator starts arithmetic operation by execution of the kernel program (Step S7).

Immediately after the accelerator starts the execution of the kernel program, the CPU may be switched from the state of performing an arithmetic operation to a PG state (Step S8). Note that the PG state refers to a state in which supply of power supply voltage to the CPU is stopped. In that case, just before the accelerator terminates the execution of the kernel program, the CPU is switched from the PG state to a state of performing an arithmetic operation (Step S9). By bringing the CPU into the PG state during the period from Step S8 to Step S9, the power consumption and heat generation of the semiconductor device as a whole can be suppressed.

When the accelerator terminates the execution of the kernel program, output data is stored in the above-described memory portion (Step S10).

After the execution of the kernel program is terminated, in the case where the CPU confirms an instruction to transmit the output data stored in the memory portion to the main memory (Step S11), the above-described output data is transmitted to the above-described main memory and stored in the above-described main memory (Step S12).

In the case where the CPU confirms an instruction to release the region for the data allocated to the memory portion (Step S13), the region allocated to the above-described memory portion is released (Step S14).

By repeating the operations from Step S1 to Step S14 described above, part of the arithmetic operation executed by the CPU can be executed by the accelerator while the power consumption and heat generation of the CPU and the accelerator are suppressed.

This embodiment can be combined with the description of the other embodiments as appropriate.

Embodiment 4

In this embodiment, a structure of an integrated circuit including the components of the semiconductor device 100 described in the above embodiment will be described with reference to FIG. 16 and FIG. 17.

Figure 16:
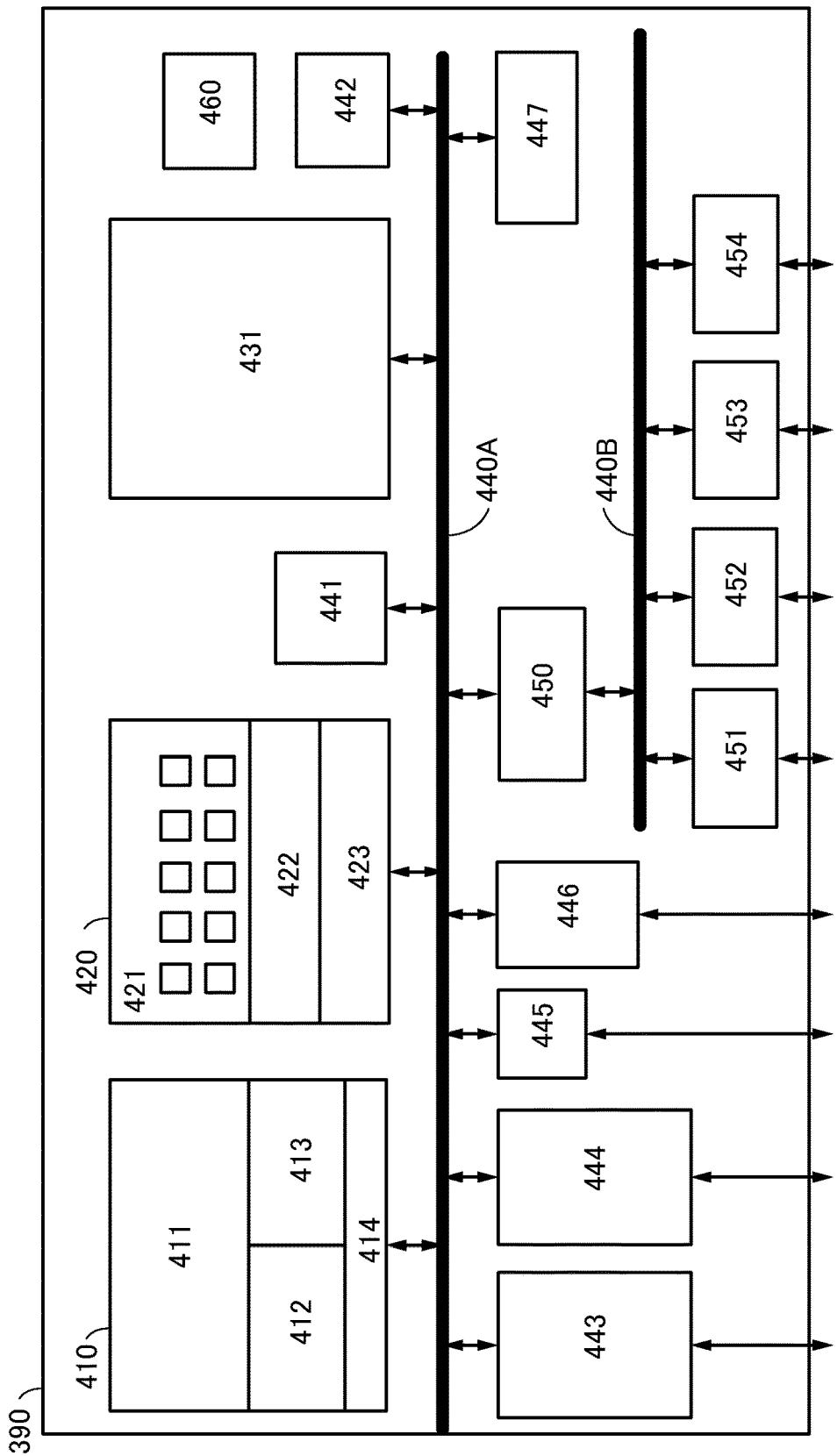
FIG. 16 is a diagram illustrating a structure example of an integrated circuit.

FIG. 16 is an example of a block diagram illustrating the structure example of the integrated circuit including the components of the semiconductor device 100.

An integrated circuit 390 illustrated in FIG. 16 includes a CPU 410, an accelerator 420, an on-chip memory 431, a DMAC (Direct Memory Access Controller) 441, a power supply circuit 460, a power management unit (PMU) 442, a security circuit 447, a memory controller 443, a DDR SDRAM (Double Data Rate Synchronous Dynamic Random Access Memory) controller 444, a USB (Universal Serial Bus) interface circuit 445, a display interface circuit 446, a bridge circuit 450, an interrupt control circuit 451, an interface circuit 452, a battery control circuit 453, and an ADC (Analog-to-digital converter)/DAC (Digital-to-analog converter) interface circuit 454.

The CPU 410 includes a CPU core 411, an instruction cache 412, a data cache 413, and a bus interface circuit 414, for example. The accelerator 420 includes a memory circuit 421, an arithmetic circuit 422, and a driver circuit 423.

The CPU core 411 includes a plurality of CPU cores. The instruction cache 412 can have a circuit structure in which an instruction executed by the CPU core 411 is temporarily stored. The data cache 413 can have a circuit structure in which data processed by the CPU core 411 or data obtained by the processing is temporarily stored. The bus interface circuit 414 can have a circuit structure that can transmit and receive signals such as data and an address to and from a bus for connecting the CPU 410 and another circuit in the integrated circuit 390.

The memory circuit 421 can have a circuit structure in which data processed by the accelerator 420 is stored. The arithmetic circuit 422 can have a circuit structure in which arithmetic operation of data retained in the memory circuit 421 is performed. The driver circuit 423 can have a circuit structure that controls the circuits in the accelerator 420.

A high-speed bus 440A is a bus for transmitting and receiving at high speed various signals between the CPU 410, the accelerator 420, the on-chip memory 431, the DMAC 441, the power management unit 442, the security circuit 447, the memory controller 443, the DDR SDRAM controller 444, the USB interface circuit 445, and the display interface circuit 446. As an example, an AMBA (Advanced Microcontoroller Bus Artcitecture)—AHB (Advanced High-perfermance Bus) can be used as a bus.

The on-chip memory 431 has a circuit structure for storing data or a program that is input into and output from the circuit included in the integrated circuit 390, e.g., the CPU 410 or the accelerator 420.

The DMAC 441 is a direct memory access controller. With the DMAC 441, a peripheral device other than the CPU 410 can access the on-chip memory 431 without through the CPU 410.

The power management unit 442 has a circuit structure for controlling power gating of circuits such as the CPU core included in the integrated circuit 390.

The security circuit 447 has a circuit structure for improving confidentiality of signals in such a manner that signals are transmitted and received between the integrated circuit 390 and an external circuit after being encrypted.

The memory controller 443 has a circuit structure for writing or reading out a program to be executed by the CPU 410 or the accelerator 420 from a program memory outside the integrated circuit 390.

The DDR SDRAM controller 444 has a circuit structure for writing or reading out data to or from a main memory, such as a DRAM, outside the integrated circuit 390.

The USB interface circuit 445 has a circuit structure for transmitting and receiving data to and from a circuit outside the integrated circuit 390 through a USB port.

The display interface circuit 446 has a circuit structure for transmitting and receiving data to and from a display device outside the integrated circuit 390.

The power supply circuit 460 is a circuit for generating voltage used in the integrated circuit 390. For example, it is a circuit that generates a negative voltage supplied to a back gate of an OS transistor for stabilizing electrical characteristics.

A low-speed bus 440B is a bus for transmitting and receiving at low speed various signals between the interrupt control circuit 451, the interface circuit 452, the battery control circuit 453, and the ADC/DAC interface circuit 454. As an example, an AMBA-APB (Advanced Peripheral Bus)

can be used as the bus. Transmission and reception of various signals between the high-speed bus 440A and the low-speed bus 440B are performed through the bridge circuit 450.

The interrupt control circuit 451 has a circuit structure for performing interrupt processing in response to a request received from a peripheral device.

The interface circuit 452 has a circuit structure for operating an interface such as a UART (Universal Asynchronous Receiver/Transmitter), an I2C (Inter-Integrated Circuit), or an SPI (Serial Peripheral Interface).

The battery control circuit 453 has a circuit structure for transmitting and receiving data related to charging and discharging of a battery outside the integrated circuit 390.

The ADC/DAC interface circuit 454 has a circuit structure for transmitting and receiving data to and from a device outside the integrated circuit 390 that outputs an analog signal, such as a MEMS (Micro Electro Mechanical Systems) device.

Figure 17A:
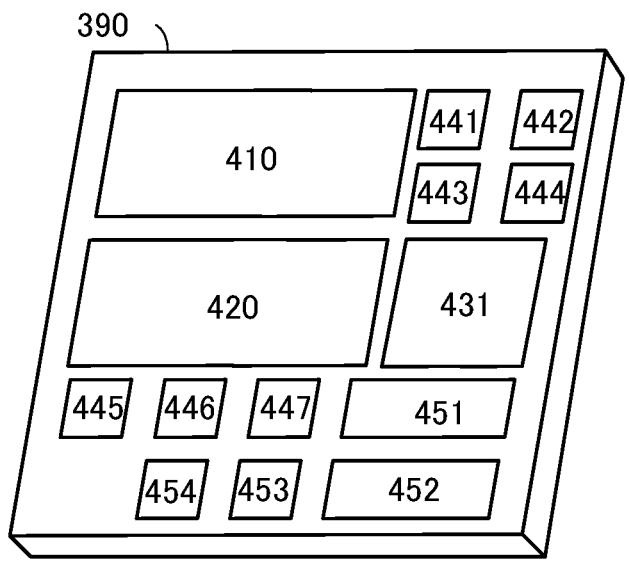
FIG. 17A and FIG. 17B are diagrams each illustrating a structure example of an integrated circuit.
Figure 17B:
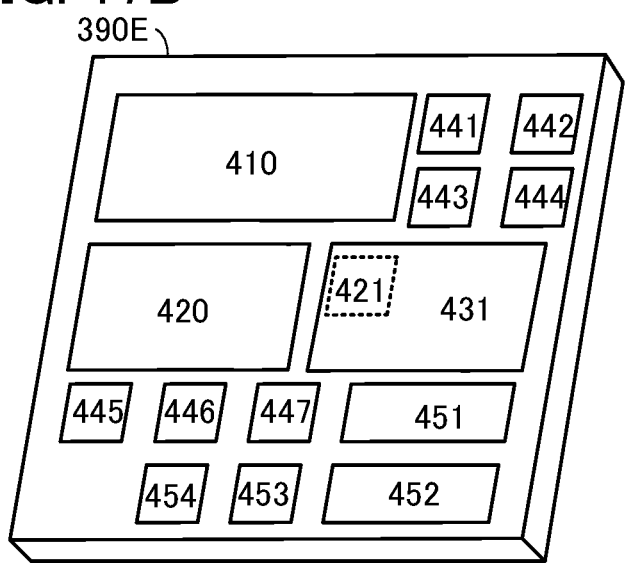

FIG. 17A and FIG. 17B are diagrams each illustrating an arrangement example of the circuit blocks when they are made into an SoC. As in the integrated circuit 390 illustrated in FIG. 17A, the components illustrated in the block diagram of FIG. 16 can be arranged on a chip by being divided into regions.

Note that the on-chip memory 431 illustrated in FIG. 16 can be configured with a memory circuit including an OS transistor, for example, a NOSRAM. That is, the on-chip memory 431 and the memory circuit 421 have the same circuit structures. Therefore, when the SoC is made, the on-chip memory 431 and the memory circuit 421 can be arranged in the same region by being integrated as in an integrated circuit 390E illustrated in FIG. 17B.

According to one embodiment of the present invention described above, a novel semiconductor device and electronic device can be provided. Alternatively, according to one embodiment of the present invention, a semiconductor device and an electronic device having low power consumption can be provided. Alternatively, according to one embodiment of the present invention, a semiconductor device and an electronic device capable of suppressing heat generation can be provided.

This embodiment can be combined with the description of the other embodiments as appropriate.

Embodiment 5

In this embodiment, an electronic device, a moving object, and an arithmetic system in which the integrated circuit 390 described in the above embodiment can be used will be described with reference to FIG. 18 to FIG. 20.

Figure 18B:
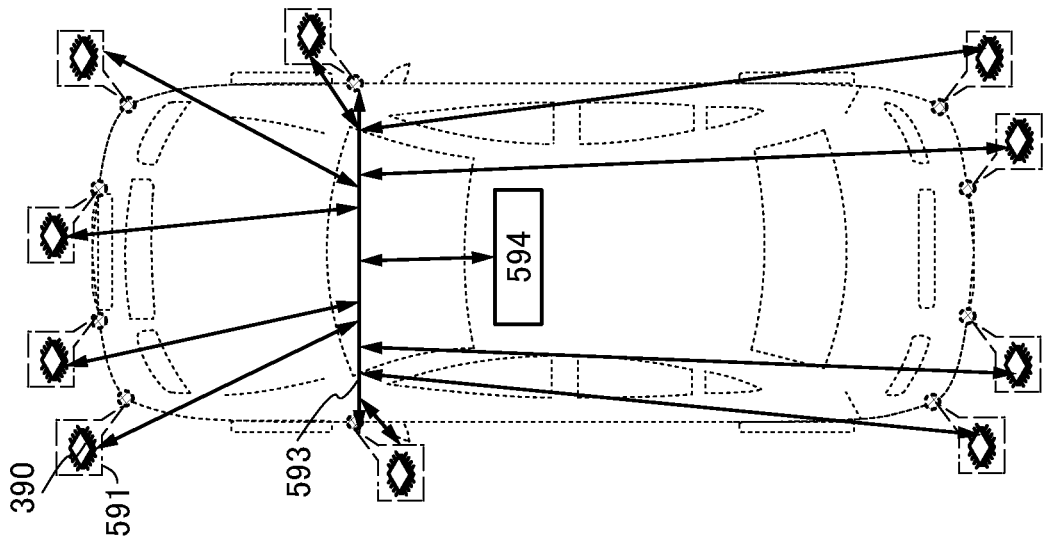
FIG. 18A and FIG. 18B are diagrams illustrating an application example of an integrated circuit.
Figure 18A:
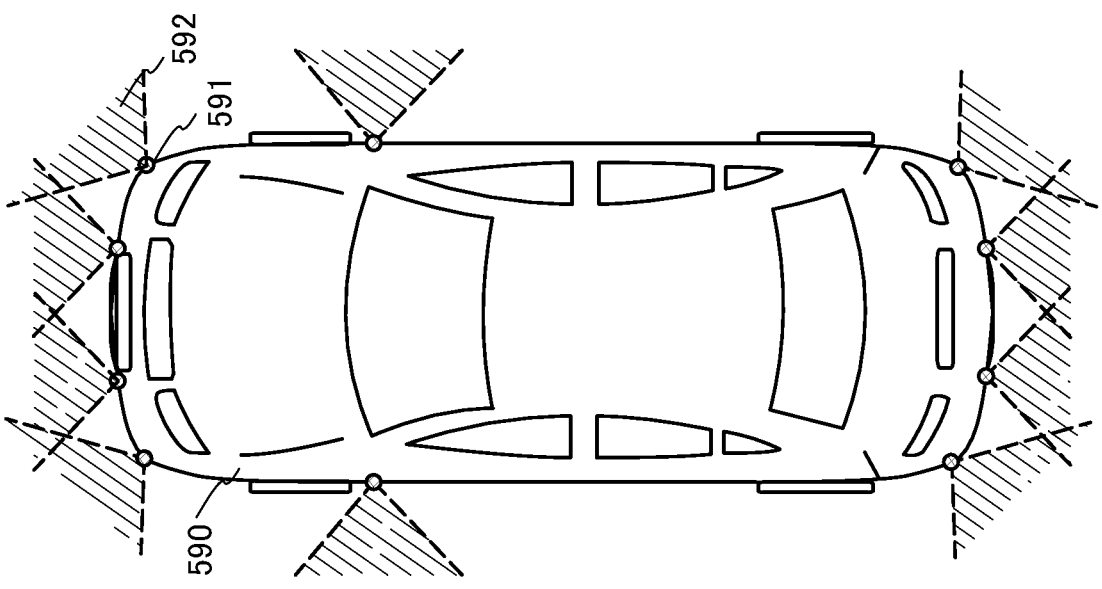

FIG. 18A illustrates an external view of an automobile as an example of a moving object. FIG. 18B is a simplified diagram illustrating data transmission in the automobile. An automobile 590 includes a plurality of cameras 591 and the like. The automobile 590 also includes various sensors such as an infrared radar, a millimeter wave radar, and a laser radar (not illustrated) and the like.

In the automobile 590, the above-described integrated circuit 390 can be used for the camera 591 and the like. The automobile 590 can perform autonomous driving by judging surrounding traffic information such as the presence of a guardrail or a pedestrian in such a manner that the camera 591 processes a plurality of images taken in a plurality of imaging directions 592 with the integrated circuit 390 described in the above embodiment and the plurality of images are analyzed together with a host controller 594 and the like through a bus 593 and the like. The integrated circuit 390 can be used for a system for navigation, risk prediction, or the like.

When arithmetic processing of a neural network or the like is performed on the obtained image data in the integrated circuit 390, for example, processing for the following can be performed: an increase in image resolution, a reduction in image noise, face recognition (for security reasons or the like), object recognition (for autonomous driving or the like), image compression, image compensation (a wide dynamic range), restoration of an image of a lensless image sensor, positioning, character recognition, and a reduction of glare and reflection.

Note that although an automobile is described above as an example of a moving object, the moving object is not limited to an automobile. Examples of moving objects also include a train, a monorail train, a ship, and a flying object (a helicopter, an unmanned aircraft (a drone), an airplane, and a rocket), and these moving objects can include a system utilizing artificial intelligence when equipped with the computer of one embodiment of the present invention.

Figure 19A:
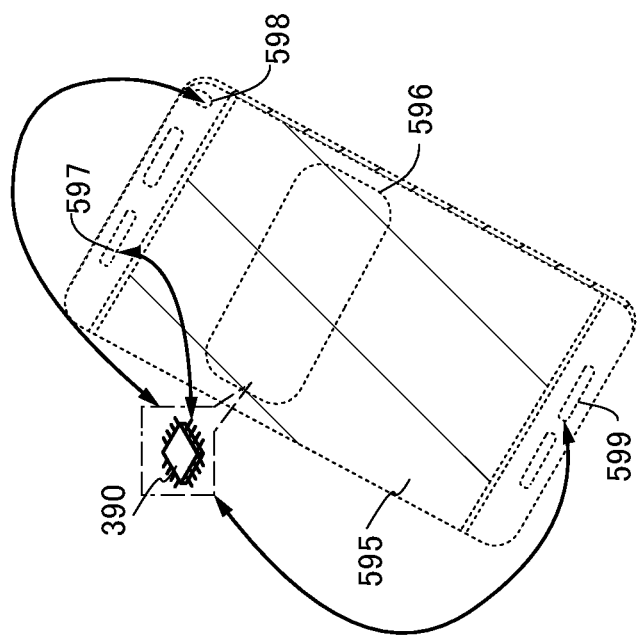
FIG. 19A and FIG. 19B are diagrams each illustrating an application example of an integrated circuit.
Figure 19B:
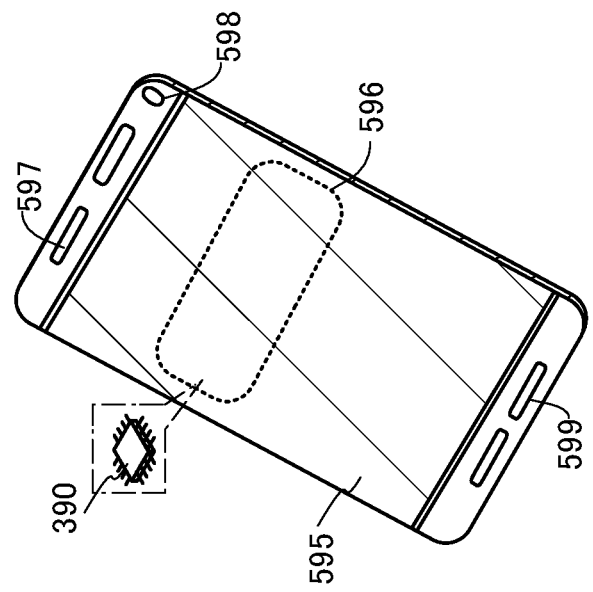

FIG. 19A is an external diagram illustrating an example of a portable electronic device. FIG. 19B is a simplified diagram illustrating data transmission in the portable electronic device. A portable electronic device 595 includes a printed wiring board 596, a speaker 597, a camera 598, a microphone 599, and the like.

In the portable electronic device 595, the printed wiring board 596 can be provided with the above-described integrated circuit 390. The portable electronic device 595 processes and analyzes a plurality of pieces of data obtained from the speaker 597, the camera 598, the microphone 599, and the like with the integrated circuit 390 described in the above embodiment, whereby the user's convenience can be improved. The integrated circuit 390 can be used for a system for voice guidance, image search, or the like.

When arithmetic processing of a neural network or the like is performed on the obtained image data in the integrated circuit 390, for example, processing for the following can be performed: an increase in image resolution, a reduction in image noise, face recognition (for security reasons or the like), object recognition (for autonomous driving or the like), image compression, image compensation (a wide dynamic range), restoration of an image of a lensless image sensor, positioning, character recognition, and a reduction of glare and reflection.

Figure 20A:
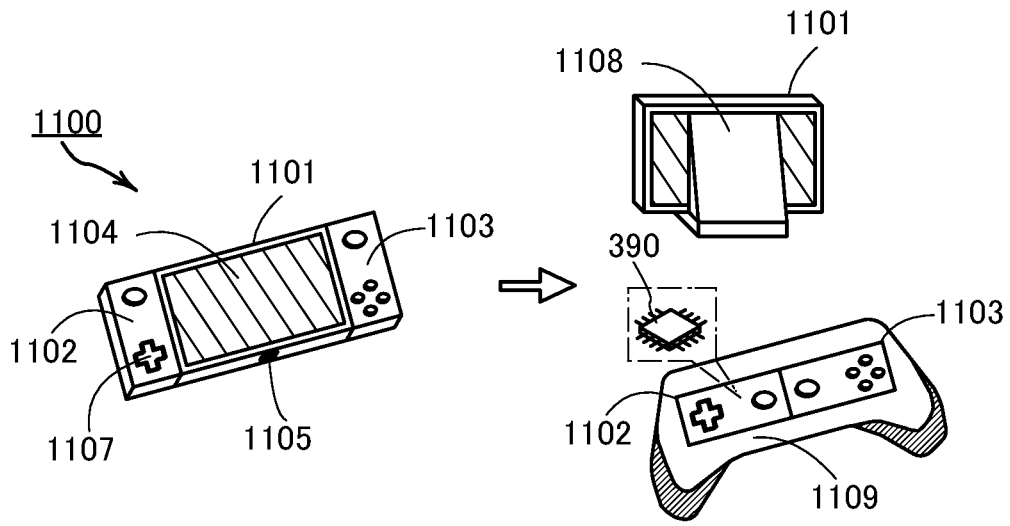
FIG. 20A, FIG. 20B, and FIG. 20C are diagrams each illustrating an application example of an integrated circuit.

A portable game machine 1100 illustrated in FIG. 20A includes a housing 1101, a housing 1102, a housing 1103, a display portion 1104, a connection portion 1105, operation keys 1107, and the like. The housing 1101, the housing 1102, and the housing 1103 can be detached. When the connection portion 1105 provided in the housing 1101 is attached to a housing 1108, a video to be output to the display portion 1104 can be output to another video device. Alternatively, the housing 1102 and the housing 1103 are attached to a housing 1109, whereby the housing 1102 and the housing 1103 are integrated and function as an operation portion. The integrated circuit 390 described in the above embodiment can be incorporated into a chip provided on a substrate in the housing 1102 and the housing 1103, for example.

Figure 20B:
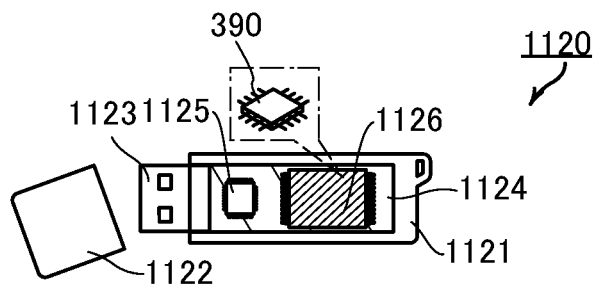

FIG. 20B is a USB connection stick type electronic device 1120. The electronic device 1120 includes a housing 1121, a cap 1122, a USB connector 1123, and a substrate 1124. The substrate 1124 is held in the housing 1121. For example, a memory chip 1125 and a controller chip 1126 are attached to the substrate 1124. The integrated circuit 390 described in the above embodiment can be incorporated into the controller chip 1126 or the like of the substrate 1124.

Figure 20C:
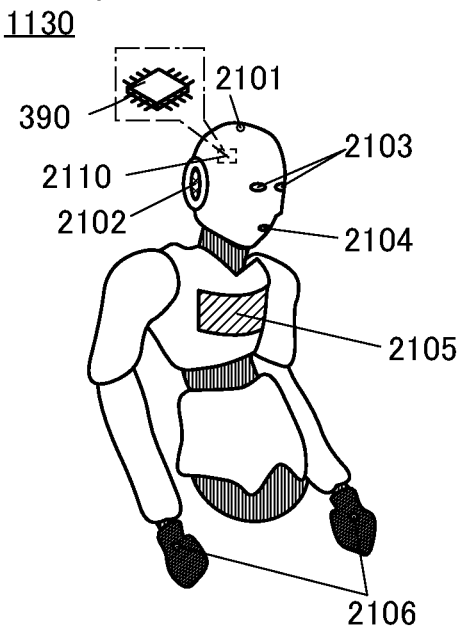

FIG. 20C is a humanoid robot 1130. The robot 1130 includes sensors 2101 to 2106 and a control circuit 2110. For example, the integrated circuit 390 described in the above embodiment can be incorporated into the control circuit 2110.

This embodiment can be combined with the description of the other embodiments as appropriate.

(Supplementary Notes on Description in this Specification and the Like)

The description of the above embodiments and each structure in the embodiments are noted below.

One embodiment of the present invention can be constituted by combining, as appropriate, the structure described in each embodiment with the structures described in the other embodiments and Example. In addition, in the case where a plurality of structure examples are described in one embodiment, the structure examples can be combined as appropriate.

Note that content (or part of the content) described in one embodiment can be applied to, combined with, or replaced with another content (or part of the content) described in the embodiment and/or content (or part of the content) described in another embodiment or other embodiments.

Note that in each embodiment, a content described in the embodiment is a content described with reference to a variety of drawings or a content described with text disclosed in the specification.

Note that by combining a diagram (or part thereof) described in one embodiment with another part of the diagram, a different diagram (or part thereof) described in the embodiment, and/or a diagram (or part thereof) described in another embodiment or other embodiments, much more diagrams can be formed.

In addition, in this specification and the like, components are classified on the basis of the functions, and shown as blocks independent of one another in block diagrams. However, in an actual circuit or the like, it is difficult to separate components on the basis of the functions, and there are such a case where one circuit is associated with a plurality of functions and a case where a plurality of circuits are associated with one function. Therefore, blocks in the block diagrams are not limited by the components described in this specification, and the description can be changed appropriately depending on the situation.

In drawings, the size, the layer thickness, or the region is shown arbitrarily for description convenience. Therefore, they are not limited to the illustrated scale. Note that the drawings are schematically shown for clarity, and embodiments of the present invention are not limited to shapes or values shown in the drawings. For example, variation in signal, voltage, or current due to noise or variation in signal, voltage, or current due to difference in timing can be included.

Furthermore, the positional relationship between components illustrated in the drawings and the like is relative. Therefore, when the components are described with reference to drawings, terms for describing the positional relationship, such as "over" and "under", are sometimes used for convenience. The positional relationship of the components is not limited to that described in this specification and can be explained with other terms as appropriate depending on the situation.

In this specification and the like, expressions "one of a source and a drain" (or a first electrode or a first terminal) and "the other of the source and the drain" (or a second electrode or a second terminal) are used in the description of the connection relationship of a transistor. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation.

In addition, in this specification and the like, the terms "electrode" and "wiring" do not functionally limit these components. For example, an "electrode" is used as part of a "wiring" in some cases, and vice versa. Furthermore, the term "electrode" or "wiring" also includes the case where a plurality of "electrodes" or "wirings" are formed in an integrated manner, for example.

In this specification and the like, voltage and potential can be replaced with each other as appropriate. The voltage refers to a potential difference from a reference potential, and when the reference potential is a ground voltage, for example, the voltage can be rephrased into the potential. The ground potential does not necessarily mean 0 V. Note that potentials are relative, and the potential supplied to a wiring or the like is changed depending on the reference potential, in some cases.

In this specification and the like, a node can be referred to as a terminal, a wiring, an electrode, a conductive layer, a conductor, an impurity region, or the like depending on a circuit structure, a device structure, or the like. Furthermore, a terminal, a wiring, or the like can be referred to as a node.

In this specification and the like, the expression "A and B are connected" means the case where A and B are electrically connected. Here, the expression "A and B are electrically connected" means connection that enables electrical signal transmission between A and B in the case where an object (that refers to an element such as a switch, a transistor element, or a diode, a circuit including the element and a wiring, or the like) exists between A and B. Note that the case where A and B are electrically connected includes the case where A and B are directly connected. Here, the expression "A and B are directly connected" means connection that enables electrical signal transmission between A and B through a wiring (or an electrode) or the like, not through the above object. In other words, direct connection refers to connection that can be regarded as the same circuit diagram when indicated as an equivalent circuit.

In this specification and the like, a switch has a function of controlling whether current flows or not by being in a conduction state (an on state) or a non-conduction state (an off state). Alternatively, a switch has a function of selecting and changing a current path.

In this specification and the like, channel length refers to, for example, the distance between a source and a drain in a region where a semiconductor (or a portion where current flows in a semiconductor when a transistor is in an on state) and a gate overlap with each other or a region where a channel is formed in a top view of the transistor.

In this specification and the like, channel width refers to, for example, the length of a portion where a source and a drain face each other in a region where a semiconductor (or a portion where current flows in a semiconductor when a transistor is in an on state) and a gate electrode overlap with each other or a region where a channel is formed.

Note that in this specification and the like, the terms "film", "layer", and the like can be interchanged with each other depending on the case or according to circumstances. For example, the term "conductive layer" can be changed into the term "conductive film" in some cases. As another example, the term "insulating film" can be changed into the term "insulating layer" in some cases.

REFERENCE NUMERALS

100: semiconductor device, 100P: semiconductor device, 101: logic portion, 101A: logic portion, 101B: logic portion, 101C: logic portion, 103: p-channel transistor, 104: n-channel transistor, 105: transistor region, 106: transistor region, 108: control portion, 110: arithmetic portion, 111: transistor, 112: capacitor, 200: semiconductor device, 201: logic portion, 201A: logic portion, 201B: logic portion, 204: p-channel transistor, 205: p-channel transistor, 206: n-channel transistor, 207: n-channel transistor, 210: semiconductor device, 211: logic portion, 214: p-channel transistor, 215: p-channel transistor, 216: n-channel transistor, 217: n-channel transistor, 220: semiconductor device, 221: transistor, 222: transistor, 300: silicon substrate, 301: insulating layer, 302: insulating layer, 303: semiconductor layer, 305: region, 306: well region, 308: insulating layer, 310: semiconductor layer, 310A: impurity region, 310B: impurity region, 310C: channel formation region, 312: impurity region, 314: insulating layer, 316: conductive layer, 318: insulating layer, 322A: conductive layer, 322B: conductive layer, 322C: conductive layer, 322D: conductive layer, 324: insulating layer, 326: conductive layer, 328: insulating layer, 330: conductive layer, 332: insulating layer, 334: conductive layer, 336: insulating layer, 338: conductive layer, 340: insulating layer, 342: semiconductor layer, 344: conductive layer, 344A: conductive layer, 344B: conductive layer, 346: insulating layer, 348: insulating layer, 350: insulating layer, 352: conductive layer, 354: insulating layer, 356: insulating layer, 358: conductive layer, 360: insulating layer, 362: conductive layer, 390: integrated circuit, 390E: integrated circuit, 410: CPU, 411: CPU core, 412: instruction cache, 413: data cache, 414: bus interface circuit, 420: accelerator, 421: memory circuit, 422: arithmetic circuit, 423: driver circuit, 431: on-chip memory, 440A: high-speed bus, 440B: low-speed bus, 441: DMAC, 442: power management unit, 443: memory controller, 444: SDRAM controller, 445: USB interface circuit, 446: display interface circuit, 447: security circuit, 450: bridge circuit, 451: control circuit, 452: interface circuit, 453: battery control circuit, 454: ADC/DAC interface circuit, 460: power supply circuit, 510: CPU, 511: CPU core, 512: backup circuit, 515: backup circuit, 520: accelerator, 521: arithmetic processing portion, 522: memory portion, 523: arithmetic circuit, 524: memory circuit, 530: bus, 590: automobile, 591: camera, 592: imaging direction, 593: bus, 594: host controller, 595: portable electronic device, 596: printed wiring board, 597: speaker, 598: camera, 599: microphone, 1100: portable game machine, 1101: housing, 1102: housing, 1103: housing, 1104: display portion, 1105: connection portion, 1107: operation key, 1108: housing, 1109: housing, 1120: electronic device, 1121: housing, 1122: cap, 1123: USB connector, 1124: substrate, 1125: memory chip, 1126: controller chip, 1130: robot, 2101: sensor, 2106: sensor, 2110: control circuit, 3404: insulating layer, 3420: semiconductor layer

The invention claimed is:

1. A semiconductor device comprising:
a p-channel transistor and a first n-channel transistor provided over a silicon substrate,
wherein one of a source and a drain of the p-channel transistor is electrically connected to a first power supply line, one of a source and a drain of the first n-channel transistor is electrically connected to a second power supply line, and the other of the source and the drain of the p-channel transistor is electrically connected to the other of the source and the drain of the first n-channel transistor,
wherein the p-channel transistor comprises a first gate electrode and a first back gate electrode provided to face the first gate electrode with a first channel formation region therebetween,
wherein the first back gate electrode is electrically connected to one of a source and a drain of a second n-channel transistor,
wherein the second n-channel transistor comprises a semiconductor layer including a metal oxide,
wherein the first back gate electrode is formed using a region where an impurity element imparting conductivity is selectively introduced to the silicon substrate,
wherein the first n-channel transistor comprises a second gate electrode and a second back gate electrode provided to face the second gate electrode with a second channel formation region therebetween,
wherein the first n-channel transistor is provided above a layer comprising the p-channel transistor, and
wherein a potential supplied to the first back gate electrode is different from a potential supplied to the second back gate electrode.

2. The semiconductor device according to claim 1, wherein the second channel formation region comprises a metal oxide.

3. The semiconductor device according to claim 2, wherein the metal oxide comprises In, Ga, and Zn.

4. The semiconductor device according to claim 1, wherein a potential supplied to the first back gate electrode is higher than a potential supplied to the second back gate electrode.

* * * * *